US012658258B2

(12) United States Patent
Joshua et al.

(10) Patent No.: US 12,658,258 B2
(45) Date of Patent: Jun. 16, 2026

(54) EVEN/ODD WORD LINE DRIVING IN 3D MEMORY

(71) Applicant: Sandisk Technologies, Inc., Milpitas, CA (US)

(72) Inventors: Alvin Joshua, Fujisawa (JP); Hardwell Chibvongodze, Hiratsuka (JP); Zhixin Cui, Fremont, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 205 days.

(21) Appl. No.: 18/508,554

(22) Filed: Nov. 14, 2023

(65) Prior Publication Data

US 2025/0157538 A1 May 15, 2025

(51) Int. Cl.
*G11C 16/08* (2006.01)
*G11C 16/04* (2006.01)
*H10B 80/00* (2023.01)
*H10W 90/00* (2026.01)

(52) U.S. Cl.
CPC .......... *G11C 16/08* (2013.01); *G11C 16/0483* (2013.01); *H10B 80/00* (2023.02); *H10W 90/00* (2026.01); *H10W 90/792* (2026.01)

(58) Field of Classification Search
CPC ....... G11C 5/063; G11C 7/18; G11C 11/4097; G11C 5/025; G11C 5/04
USPC ..................................................... 365/63, 51
See application file for complete search history.

(56) References Cited

U.S. PATENT DOCUMENTS

| | | | |
|---|---|---|---|
| 7,170,783 B2 | 1/2007 | Ha et al. | |
| 8,952,426 B2 | 2/2015 | Maejima | |
| 9,330,761 B2 | 5/2016 | Maejima | |
| 9,721,663 B1 * | 8/2017 | Ogawa ................... | H10B 43/27 |
| 9,953,992 B1 | 4/2018 | Ogawa et al. | |
| 10,026,747 B2 | 7/2018 | Hwang et al. | |
| 10,832,743 B2 * | 11/2020 | Kawasumi ............... | G11C 8/08 |
| 11,222,881 B2 | 1/2022 | Zhang et al. | |
| 2015/0348613 A1 * | 12/2015 | Vogelsang .......... | G11C 11/4093 |
| | | | 365/51 |
| 2017/0358354 A1 * | 12/2017 | Alsmeier ............... | H10B 43/20 |
| 2022/0077128 A1 | 3/2022 | Chiba et al. | |
| 2022/0157842 A1 | 5/2022 | Tsutsumi et al. | |

* cited by examiner

*Primary Examiner* — Sultana Begum
(74) *Attorney, Agent, or Firm* — Pearl Cohen Zedek Latzer Baratz LLP

(57) ABSTRACT

Technology for driving word lines in 3D memory. Even numbered word lines in a 3D memory are biased from one end of the word lines and odd numbered word lines in the 3D memory are biased from the other end of the word lines. The word lines may reside in a stack of alternating conductive and dielectric layers, with the conductive layers serving as the word lines as well as select lines. The ends of the word lines on one side of the stack may form a first staircase and the ends of the word lines on an opposite side of the stack may form a second staircase. A first set of word line driver transistors connect to the even numbered word lines at the first staircase and a second set of word line driver transistors connect to the odd numbered word lines at the second staircase.

18 Claims, 25 Drawing Sheets

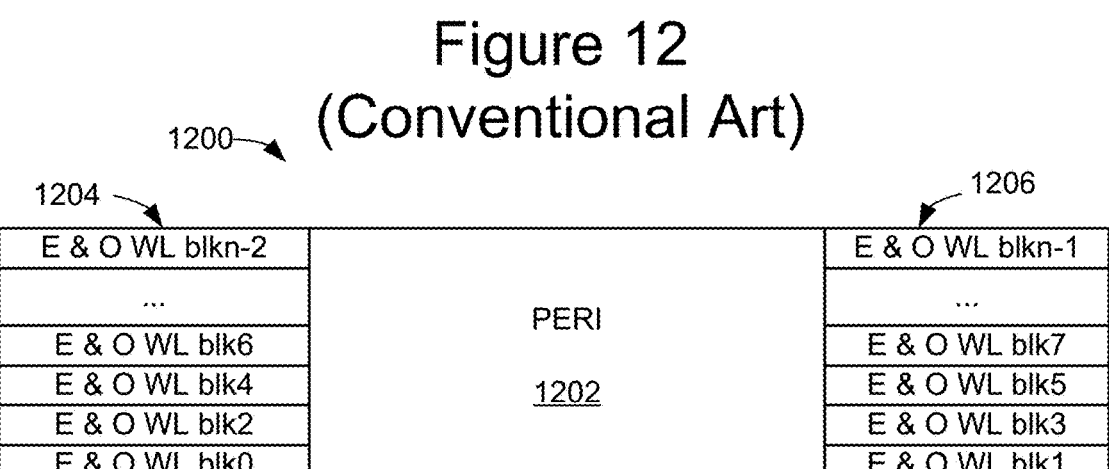

| 1204 | | 1206 |
|---|---|---|
| E & O WL blkn-2 | | E & O WL blkn-1 |
| ... | PERI | ... |
| E & O WL blk6 | | E & O WL blk7 |
| E & O WL blk4 | 1202 | E & O WL blk5 |
| E & O WL blk2 | | E & O WL blk3 |
| E & O WL blk0 | | E & O WL blk1 |

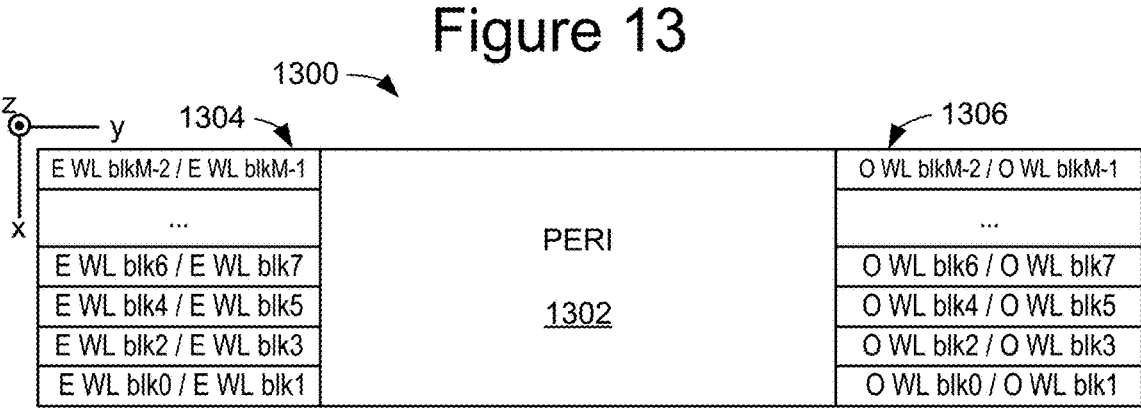

| 1304 | | 1306 |
|---|---|---|
| E WL blkM-2 / E WL blkM-1 | | O WL blkM-2 / O WL blkM-1 |
| ... | PERI | ... |
| E WL blk6 / E WL blk7 | | O WL blk6 / O WL blk7 |
| E WL blk4 / E WL blk5 | 1302 | O WL blk4 / O WL blk5 |
| E WL blk2 / E WL blk3 | | O WL blk2 / O WL blk3 |
| E WL blk0 / E WL blk1 | | O WL blk0 / O WL blk1 |

| 1404 | | 1406 |
|---|---|---|
| O WL blkM-2 / E WL blkM-1 | | EWL blkM-2/OWL blkM-1 |
| ... | PERI | ... |
| O WL blk6 / E WL blk7 | | E WL blk6 / O WL blk7 |
| O WL blk4 / E WL blk5 | 1402 | E WL blk4 / O WL blk5 |
| O WL blk2 / E WL blk3 | | E WL blk2 / O WL blk3 |
| O WL blk0 / E WL blk1 | | E WL blk0 / O WL blk1 |

Figure 15
(Conventional Art)
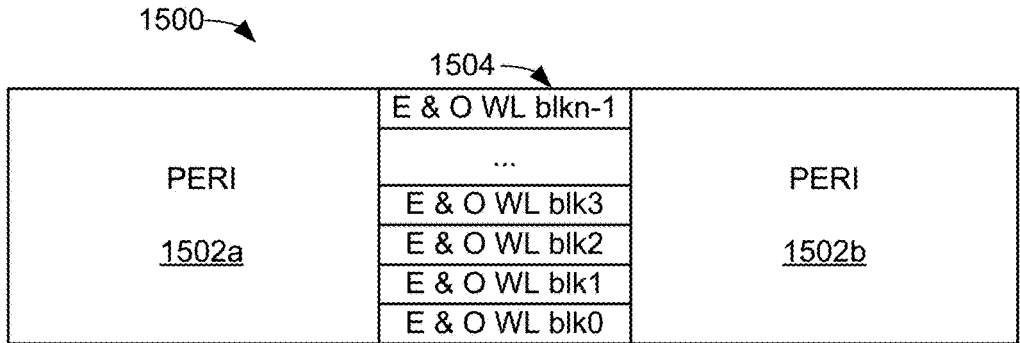
Figure 16
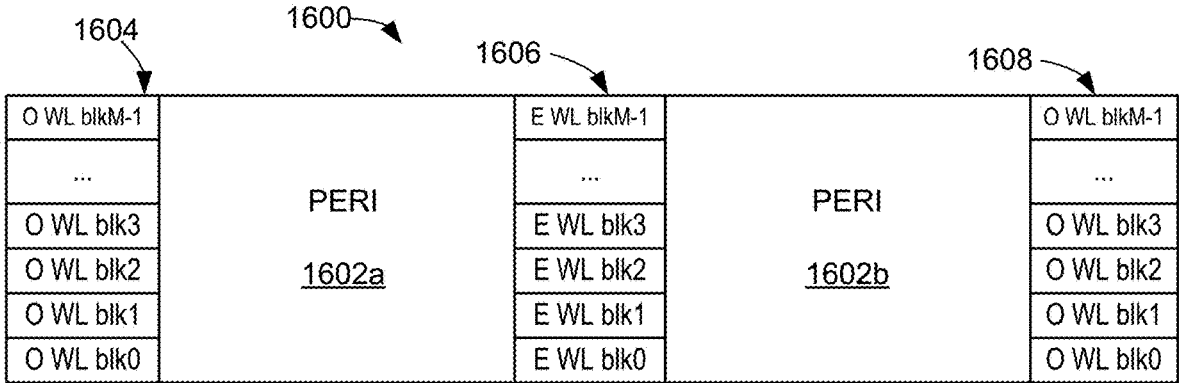
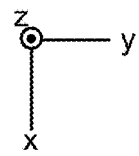

1900

EVEN/ODD WORD LINE DRIVING IN 3D MEMORY

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery). One example of non-volatile memory is flash memory (e.g., NAND-type and NOR-type flash memory).

A memory structure in the memory system typically contains many memory cells and various control lines. The memory structure may be three-dimensional (3D). One type of 3D structure has non-volatile memory cells arranged as vertical NAND strings. The 3D memory structure may be arranged into units that are commonly referred to as blocks. For example, a block in a NAND memory system contains many NAND strings. A NAND string contains memory cell transistors connected in series, a drain side select gate at one end, and a source side select gate at the other end. The drain side select gate typically has one or more transistors in series. Likewise, the source side select gate typically has one or more transistors in series. Each NAND string is associated with a bit line. The block typically has many word lines that provide voltages to control gates of the memory cell transistors. For a 3D architecture, each word line resides at a different layer of the block. Therefore, each word line (WL) may connect to the control gate of one memory cell on each NAND string in the block.

One type of three-dimensional NAND memory structure has alternating dielectric layers and conductive layers in a stack. NAND strings are formed vertically in the alternating dielectric layers and conductive layers in what may be referred to as memory holes. For example, after memory holes are drilled into the stack of alternating dielectric layers and conductive layers, the memory holes are filled in with materials including a charge-trapping material to create a vertical column of memory cells (e.g., NAND string). The conductive layers may serve as word lines or select lines.

Operating such 3D memory structures includes applying voltages to conductive lines such as word lines. Performance of memory operations such as read and write depends on the ramp up time of the voltage applied to the word lines. Word line ramp up time depends on factors such as the resistance of the word line and the capacitance between word lines. In order to improve bit density, the WL/dielectric pitch may be made smaller. However, reducing the WL/dielectric pitch may increase WL resistance and capacitance. Thus, the voltage ramp up time may increase with smaller WL/dielectric pitch. Therefore, memory operation performance time is a technical challenge and will likely be an increasing challenge with future generations of memory.

BRIEF DESCRIPTION OF THE DRAWINGS

Like-numbered elements refer to common components in the different figures.

FIG. 12 depicts an example of a conventional floorplan that includes peripheral circuits and word line switches for one plane.

FIG. 13 depicts one embodiment of a floorplan for control circuits.

FIG. 14 depicts another embodiment of a floorplan for control circuits.

FIG. 15 depicts an example of a conventional floorplan that includes peripheral circuits and word line switches for one plane.

FIG. 16 depicts one embodiment of a floorplan that includes peripheral circuits and word line switches for one plane.

DETAILED DESCRIPTION

Technology is disclosed herein for driving word lines in 3D memory. In an embodiment, even numbered word lines in a 3D memory are biased from one end of the word lines and odd numbered word lines in the 3D memory are biased from the other end of the word lines. The word lines may reside in a stack of alternating conductive and dielectric layers, with the conductive layers serving as the word lines as well as select lines. The ends of the word lines on one side of the stack may form a first staircase and the ends of the word lines on an opposite side of the stack may form a second staircase. In an embodiment, a first set of word line driver transistors connect to the even numbered word lines at the first staircase and a second set of word line driver transistors connect to the odd numbered word lines at the second staircase. Herein, the term "near end" of a word line is used to refer to the end of the word line directly connected to and driven by the WL driver transistor and the term "far end" of a word line is used to refer to the end of the word line not directly connected to a WL driver transistor. The odd/even WL voltage driving scheme provides efficient voltage ramp up at both near and far ends of the word lines. Moreover, in an embodiment, only one WL driver transistor is needed per word line, thereby not needing any sacrifice in chip floorplan for additional transistors. Furthermore, in an embodiment, a staircase only has steps for either the odd word lines or the even word lines, thereby allowing for a narrow staircase. These and other technical benefits are described in further detail below.

Figure 1:
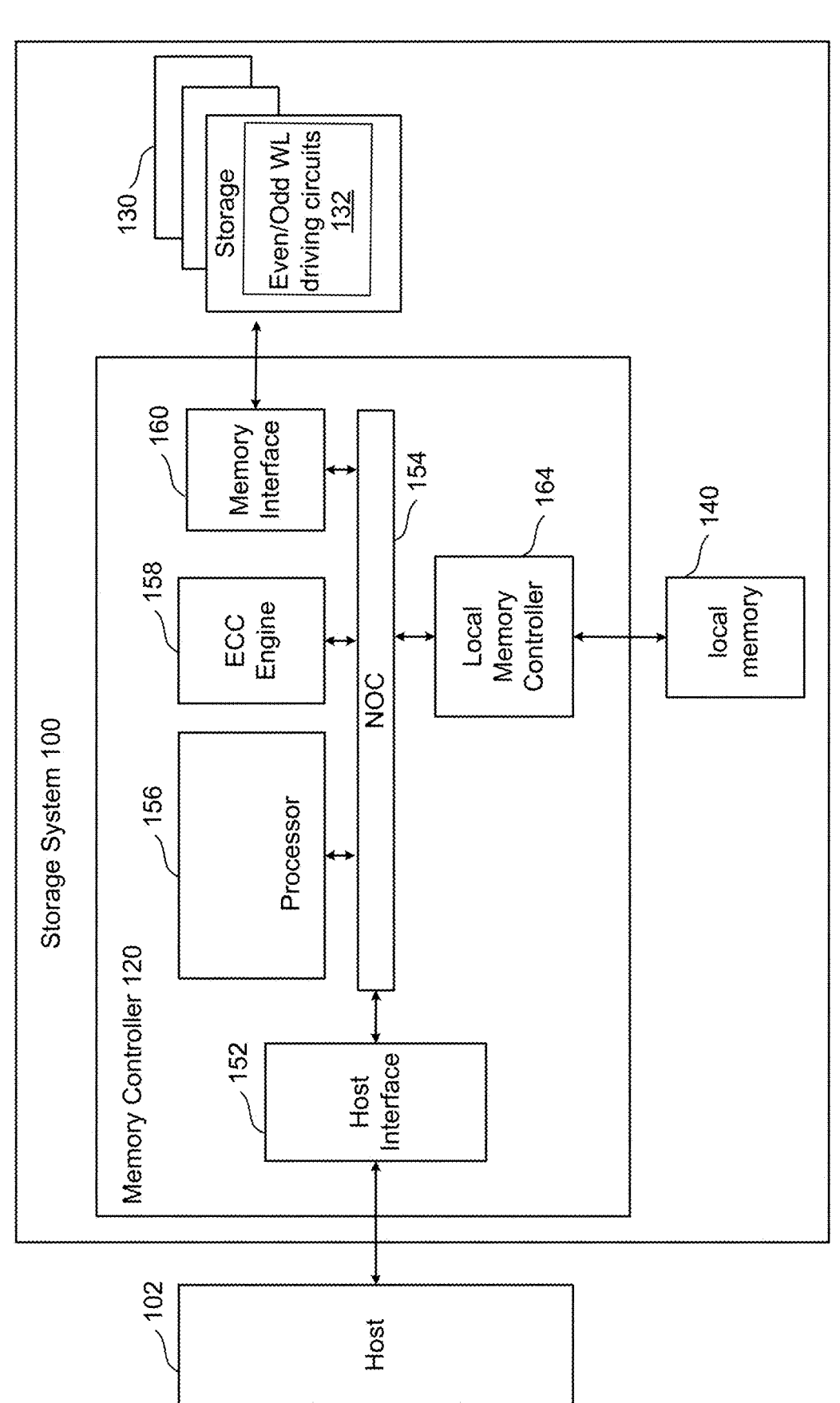
FIG. 1 is a block diagram of one embodiment of a storage system 100 that implements the technology described herein.

FIG. 1 is a block diagram of one embodiment of a storage system 100 that implements the technology described herein. In one embodiment, storage system 100 is a solid state drive ("SSD"). Storage system 100 may be referred to as a "non-volatile storage system." Storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 (or storage controller) connected to non-volatile storage 130 and optional local high speed memory 140 (e.g., DRAM, SRAM, MRAM). Non-volatile storage 130 has Even/Odd WL driving circuits 132 embodiments of which will be described in further detail below. Note that local high speed memory 140 is optional. Local memory 140 is non-transitory memory, which may include volatile memory or non-volatile memory. Local high speed memory 140 is used by memory controller 120 to perform certain operations. For example, local high speed memory 140 may store logical to physical address translation tables ("L2P tables").

Memory controller 120 comprises a host interface 152 that is connected to and in communication with host 102. In one embodiment, host interface 152 implements an NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with one or more memory die in storage 130. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory die. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a storage 130 and a subset of the L2P tables are cached (L2P cache) in the local high speed memory 140.

Memory interface 160 communicates with non-volatile storage 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
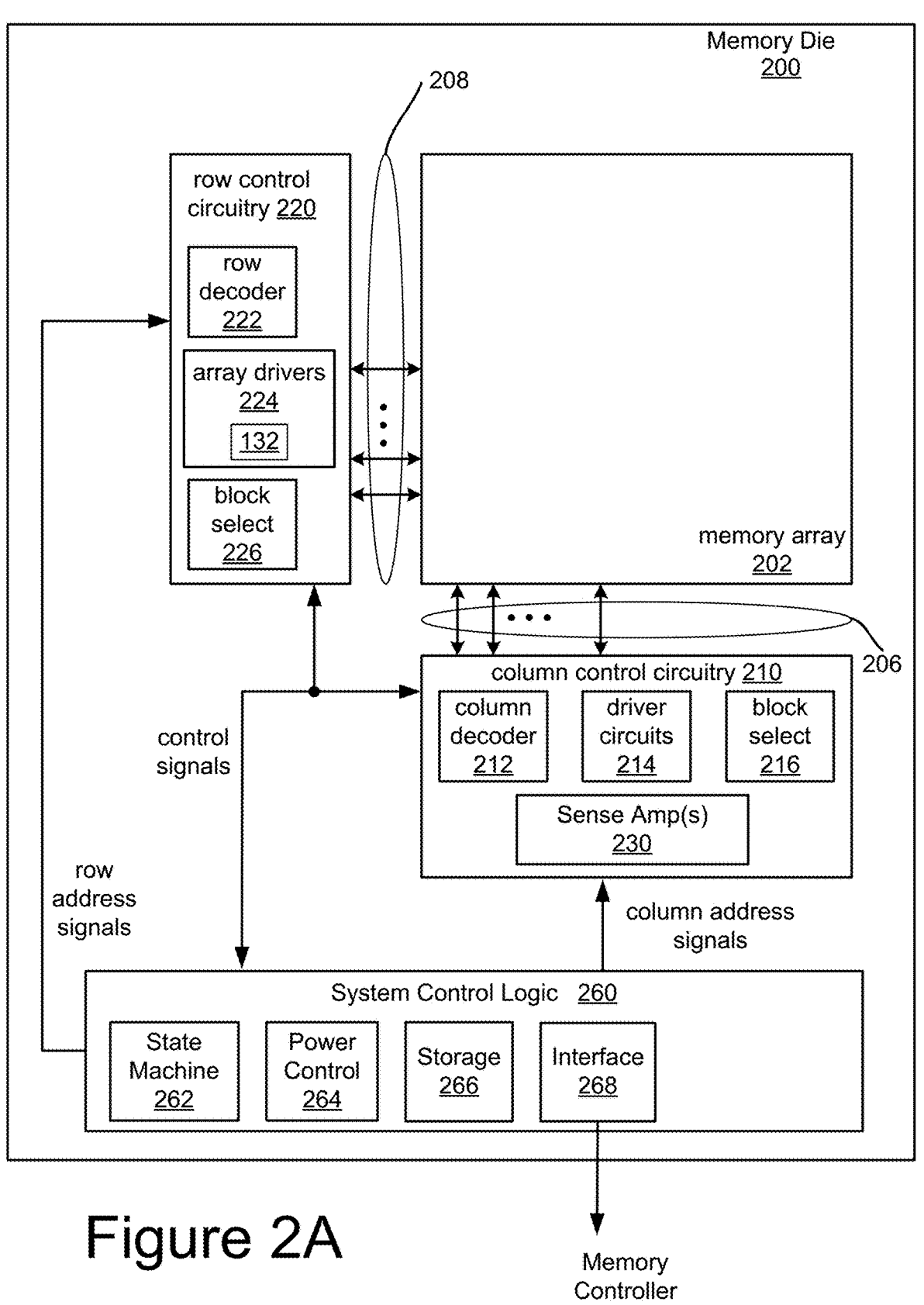
FIG. 2A is a block diagram of one embodiment of a memory die.

FIG. 2A is a functional block diagram of a memory die 200. The components depicted in FIG. 2A are electrical circuits. Memory die 200 includes a non-volatile memory array 202 (which is one example of a non-volatile memory structure) that can comprise non-volatile memory cells, as described in more detail below. The array terminal lines of memory array 202 include the various layer(s) of word lines organized as rows, and the various layer(s) of bit lines organized as columns. However, other orientations can also be implemented. Memory die 200 includes row control circuitry 220, whose outputs 208 are connected to respective word lines of the memory array 202. Row control circuitry 220 receives a group of M row address signals and one or more various control signals from System Control Logic circuit 260, and typically may include such circuits as row decoders 222, array terminal drivers 224, and block select circuitry 226 for both reading and writing (programming) operations. Row control circuitry 220 may also include read/write circuitry. Memory die 200 also includes column control circuitry 210 including sense amplifier(s) 230 whose input/outputs 206 are connected to respective bit lines of the memory array 202. Although only single block is shown for array 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers. The array drivers 224 contain even/odd WL drivers 132, embodiments of which will be described in further detail below.

System control logic 260 receives data and commands from a memory controller and provides output data and status to the host. In some embodiments, the system control logic 260 (which comprises one or more electrical circuits) include state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory array 202 during memory operations and may include charge pumps and regulator circuit for creating regulating voltages. System control logic 260 includes storage 266 (e.g., RAM, registers, latches, etc.), which may be used to store parameters for operating the memory array 202.

Commands and data are transferred between a memory controller and memory die 200 via memory controller interface 268 (also referred to as a "communication interface"). Memory controller interface 268 is an electrical interface for communicating with the memory controller. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die.

In one embodiment, memory array 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory array 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory array 202 is not limited to the examples above. Many different types of memory array architectures or memory technologies can be used to form memory array 202. No particular non-volatile memory technology is required for purposes of the new claimed embodiments proposed herein. Other examples of suitable technologies for memory cells of the memory array/structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory array 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory array 202 and (2) peripheral circuitry, where peripheral circuitry includes all of the components depicted in FIG. 2A other than memory array 202. An important characteristic of a memory circuit is its capacity, which can be increased by increasing the area of the memory die of a storage system that is given over to the memory array 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system is the amount of area to devote to the memory array 202 and the amount of area to devote to the peripheral circuitry.

Another area in which the memory array 202 and the peripheral circuitry are often at odds is in the processing involved in forming these regions, since these regions often involve differing processing technologies and the trade-off in having differing technologies on a single die. For example, when the memory array 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed dies that are then bonded together. More specifically, the memory array 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
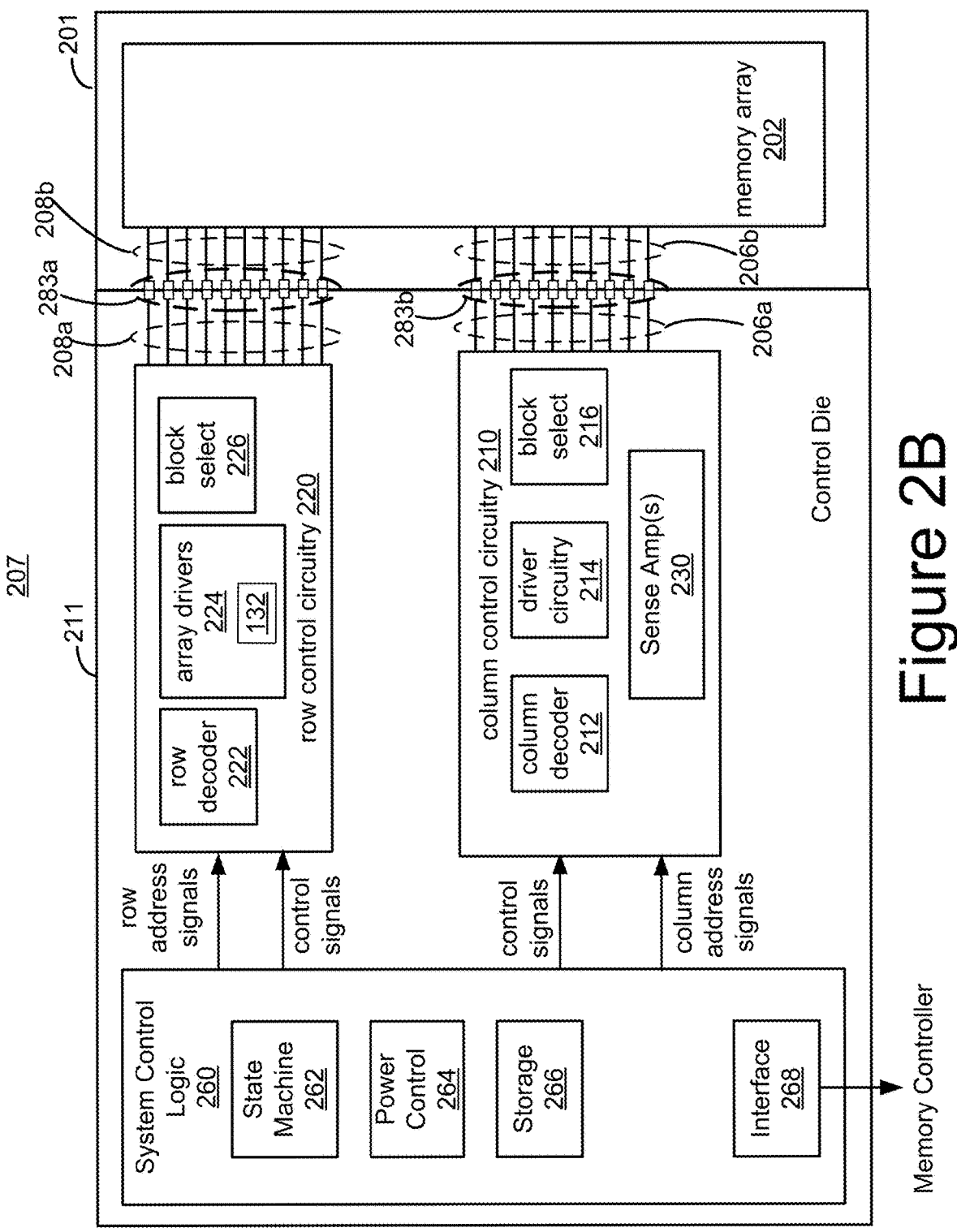
FIG. 2B is a block diagram of one embodiment of an integrated memory assembly.

FIG. 2B shows an alternative arrangement to that of FIG. 2A which may be implemented using wafer-to-wafer bonding to provide a bonded die pair comprising a memory die and a control die. In that regard, FIG. 2B is a functional block diagram of integrated memory assembly 207, which is another embodiment of a memory die assembly. The components depicted in FIG. 2B are electrical circuits. The integrated memory assembly 207 includes two types of semiconductor die (or more succinctly, "die"). Memory array die 201 includes memory array 202. Memory array 202 includes non-volatile memory cells. Control die 211 includes control circuitry 260, 210, and 220 (as described above). In some embodiments, control die 211 is configured to connect to the memory array 202 in the memory array die 201. In some embodiments, the memory array die 201 and the control die 211 are bonded together.

FIG. 2B shows an example of the peripheral circuitry, including control circuits, formed in a peripheral circuit or control die 211 coupled to memory array 202 formed in memory array die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory array die 201. In some embodiments, some of the circuitry in the system control logic 260 is located on the on the memory array die 201.

System control logic 260, row control circuitry 220, and column control circuitry 210 may be formed by a common process (e.g., CMOS process), so that adding elements and functionalities, such as ECC, more typically found on a memory controller may require few or no additional process steps (i.e., the same process steps used to fabricate controller may also be used to fabricate system control logic 260, row control circuitry 220, and column control circuitry 210). Thus, while moving such circuits from a die such as memory array die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220. In an embodiment, the control die 211 is bonded to the memory array die 201 by a large number of bond pads 283a, 283b.

FIG. 2B shows column control circuitry 210 including sense amplifier(s) 230 on the control die 211 coupled to memory array 202 on the memory array die 201 through input/outputs 206. The input/outputs 206 may comprise electrical connections between column decoder 212, driver circuitry 214, and block select 216 and bit lines of memory array 202. The input/outputs 206 may be referred to as electrical paths. A portion of the electrical path 206a is on the control die 211 and a second portion of the electrical path 206b is on the memory array die. The two portions 206a, 206b are connected by bond pads 283b. Thus, electrical paths may extend from column control circuitry 210 in control die 211 through pads on control die 211 that are bonded to corresponding pads of the memory array die 201, which are connected to bit lines of memory array 202. Each bit line of memory array 202 may have a corresponding electrical path in electrical paths 206, including a pair of bond pads, which connects to column control circuitry 210. Similarly, row control circuitry 220, including row decoder 222, array drivers 224, and block select 226 are coupled to memory array 202 through electrical paths 208. Each of electrical path 208 may correspond to a word line, dummy word line, or select gate line. First portions of the electrical paths 208a on control die 211 are connected to second portions of the electrical paths 208b on memory array die 201 by way of band pads 283a. Additional electrical paths may also be provided between control die 211 and memory array die 201.

For purposes of this document, the phrases "a control circuit" or "one or more control circuits" can include any one of or any combination of state machine 262, all or a portion of system control logic 260 (all or a portion of row control circuitry 220, all or a portion of column control circuitry 210), a microcontroller, a microprocessor, and/or other similar functioned circuits. The control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

Figure 3A:
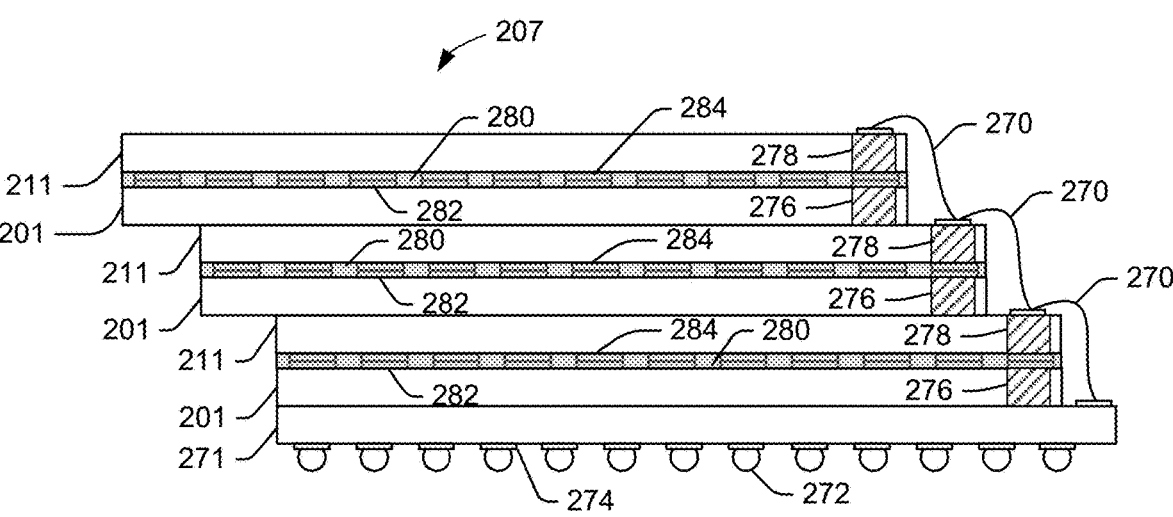
FIGS. 3A and 3B depict different embodiments of integrated memory assemblies.

In some embodiments, there is more than one control die 211 and more than one memory array die 201 in an integrated memory assembly 207. In some embodiments, the integrated memory assembly 207 includes a stack of multiple control die 211 and multiple memory array die 201. FIG. 3A depicts a side view of an embodiment of an integrated memory assembly 207 stacked on a substrate 271 (e.g., a stack comprising control dies 211 and memory dies 201). The integrated memory assembly 207 has three control dies 211 and three memory dies 201. In some embodiments, there are more than three memory dies 201 and more than three control die 211.

Each control die 211 is affixed (e.g., bonded) to at least one of the memory dies 201. Some of the bond pads 282/284 are depicted. There may be many more bond pads. A space between two dies 201, 211 that are bonded together is filled with a solid layer 280, which may be formed from epoxy or other resin or polymer. This solid layer 280 protects the electrical connections between the dies 201, 211, and further secures the dies together. Various materials may be used as solid layer 280.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory array die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and a memory controller.

Figure 3B:
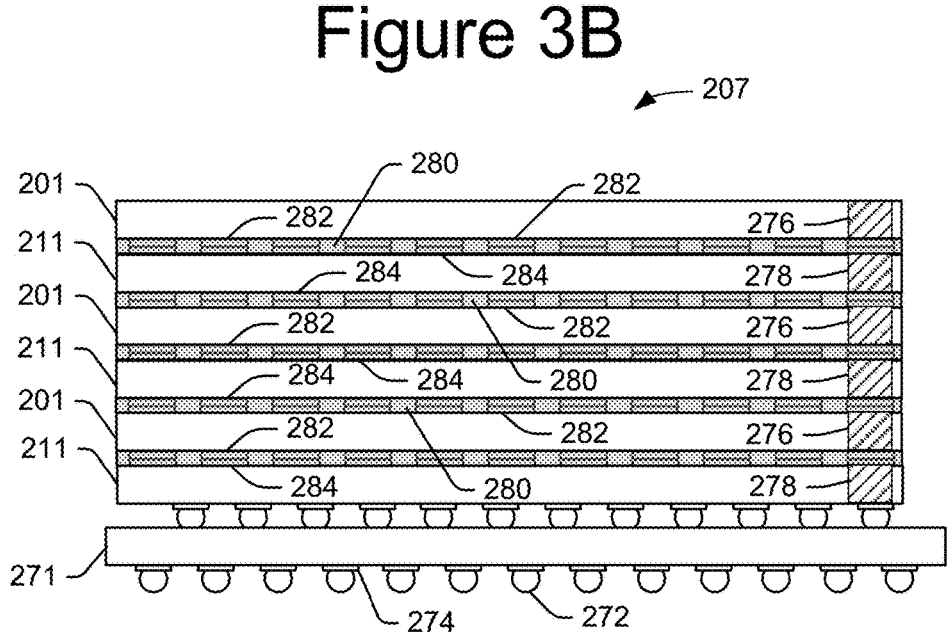

FIG. 3B depicts a side view of another embodiment of an integrated memory assembly 207 stacked on a substrate 271. The integrated memory assembly 207 of FIG. 2B has three control die 211 and three memory array die 201. In some embodiments, there are many more than three memory dies 201 and many more than three control dies 211. In this example, each control die 211 is bonded to at least one memory array die 201. Optionally, a control die 211 may be bonded to two or more memory array die 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory array die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory array die 201 may be bonded together. Bond pads on each die 201, 211 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller sizes and pitches.

Some embodiments may include a film on surface of the dies 201, 211. Where no such film is initially provided, a space between the dies may be under filled with an epoxy or other resin or polymer. The under-fill material may be applied as a liquid which then hardens into a solid layer. This under-fill step protects the electrical connections between the dies 201, 211, and further secures the dies together. Various materials may be used as under-fill material.

Figure 4:
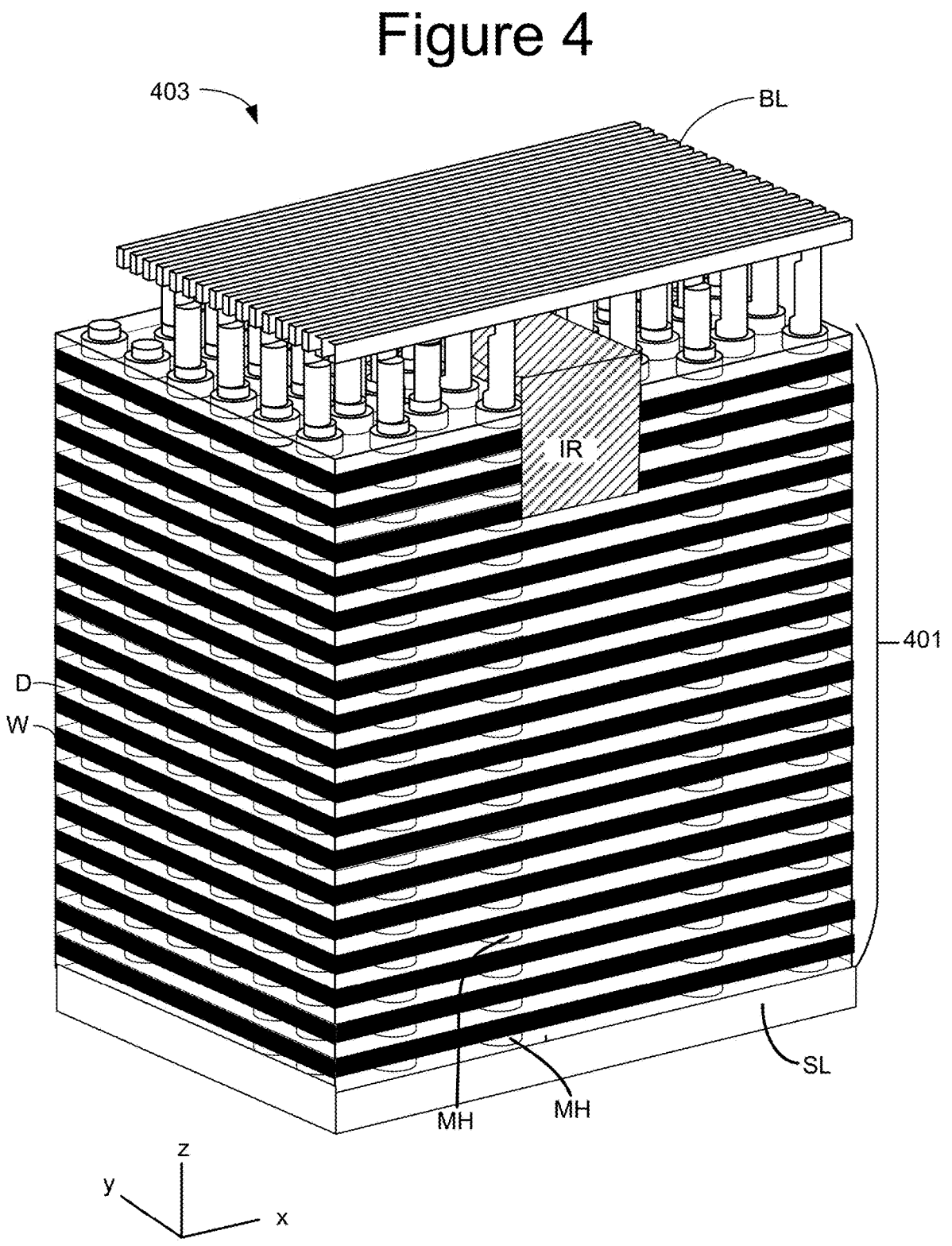
FIG. 4 is a perspective view of a portion of one example of a monolithic three dimensional memory structure.

FIG. 4 is a perspective view of a portion of one example of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. In one embodiment the alternating dielectric layers and conductive layers are divided into four (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
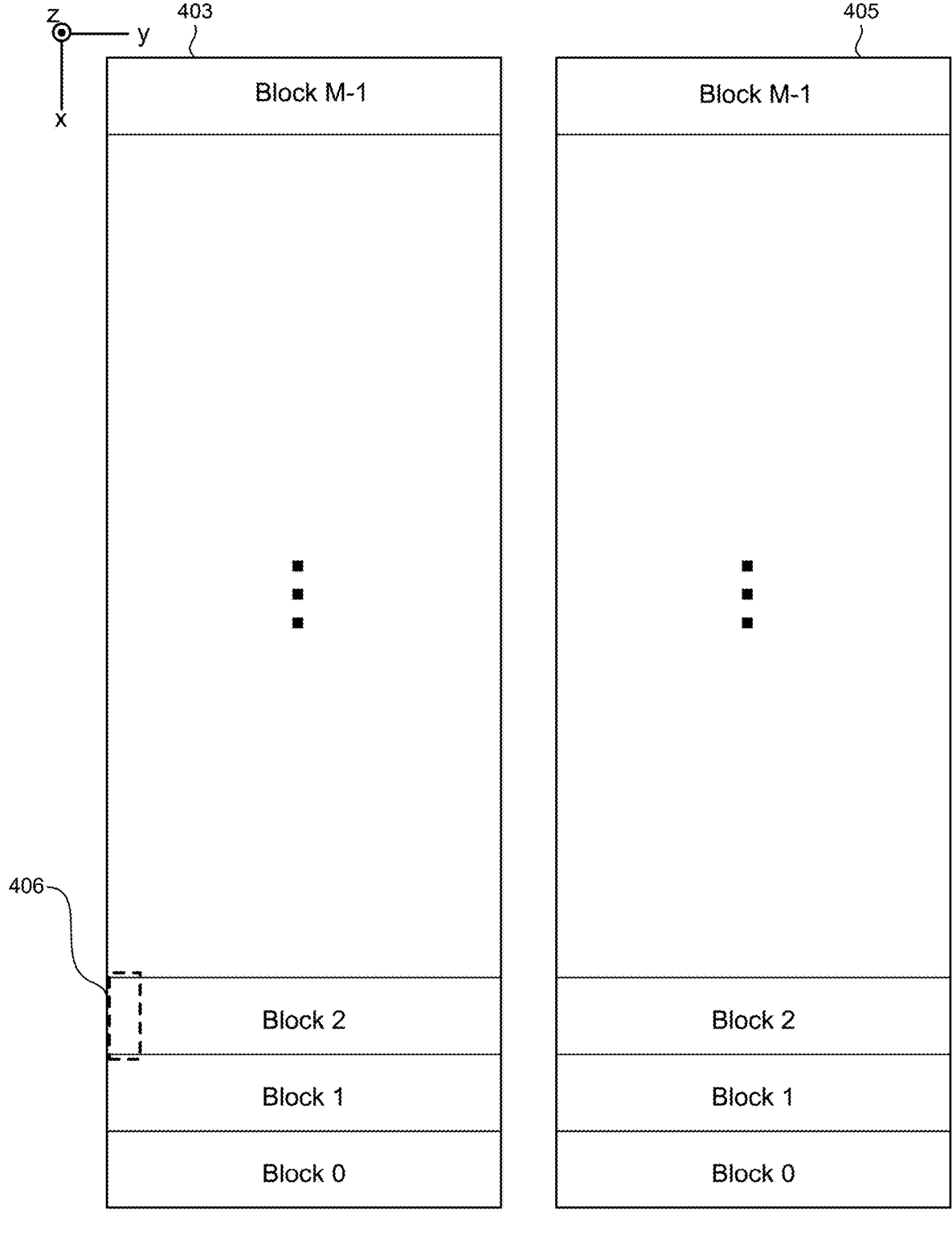
FIG. 4A is a block diagram of one example of a memory structure having two planes.

FIG. 4A is a block diagram explaining one example organization of memory structure 202, which is divided into two planes 403 and 405. Each plane is then divided into M physical blocks. In one example, each plane has about 2000 physical blocks. However, different numbers of physical blocks and planes can also be used. In one embodiment, a physical block of memory cells is a unit of erase. That is, all memory cells of a physical block are erased together. In other embodiments, physical blocks can be divided into sub-blocks and the sub-blocks can be the unit of erase. Memory cells can also be grouped into physical blocks for other reasons, such as to organize the memory structure to enable the signaling and selection circuits. In some embodiments, a physical block represents a group of connected memory cells as the memory cells of a block share a common set of word lines. For example, the word lines for a physical block are all connected to all of the vertical NAND strings for that physical block. Although FIG. 4A shows two planes 403/405, more or fewer than two planes can be implemented. In some embodiments, memory structure 202 includes four planes. In some embodiments, memory structure 202 includes eight planes. In some embodiments, programming can be performed in parallel in a first selected block in plane 403 and a second selected block in plane 405.

Figure 4B:
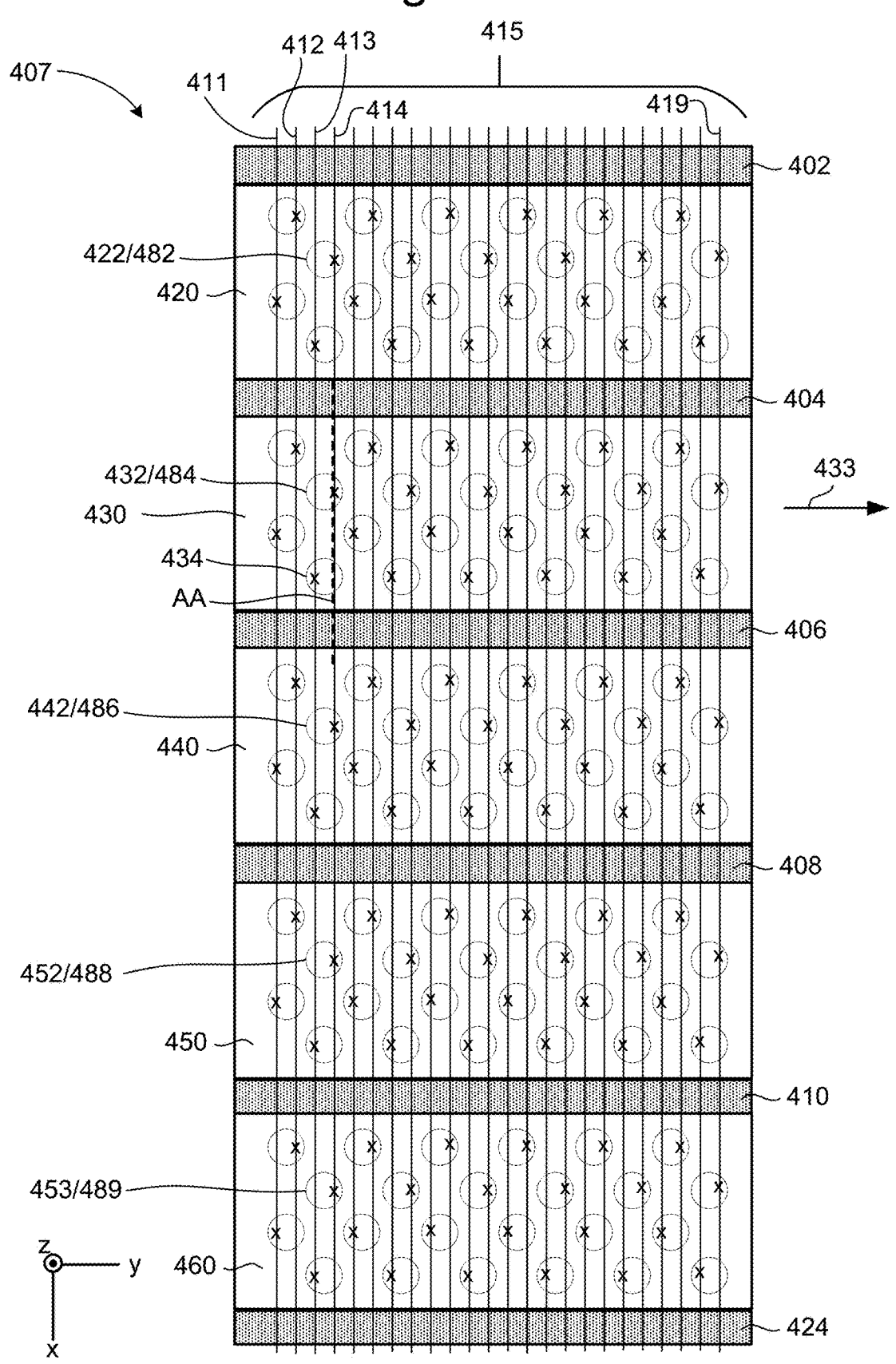
FIG. 4B is a block diagram depicting a top view of a portion of physical block of memory cells.

FIGS. 4B-4E depict an example three dimensional ("3D") NAND structure that corresponds to the structure of FIG. 4 and can be used to implement memory structure 202 of FIGS. 2A and 2B. FIG. 4B is a diagram depicting a top view of a portion 407 of Block 2. As can be seen from FIG. 4B, the physical block depicted in FIG. 4B extends in the direction of arrow 433. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442, 452 and 453. Vertical column 422 implements NAND string 482. Vertical column 432 implements NAND string 484. Vertical column 442 implements NAND string 486. Vertical column 452 implements NAND string 488. Vertical column 453 implements NAND string 486. Vertical column 452 implements NAND string 489. More details of the vertical columns are provided below. Since the physical block depicted in FIG. 4B extends in the direction of arrow 433, the physical block includes more vertical columns than depicted in FIG. 4B.

FIG. 4B also depicts a set of bit lines 415, including bit lines 411, 412, 413, 414, . . . 419. FIG. 4B shows twenty-four bit lines because only a portion of the physical block is depicted. It is contemplated that more than twenty-four bit lines connected to vertical columns of the physical block. Each of the circles representing vertical columns has an "x" to indicate its connection to one bit line. For example, bit line 414 is connected to vertical columns 422, 432, 442, 452 and 453.

The physical block depicted in FIG. 4B includes a set of isolation regions 402, 404, 406, 408, 410, and 424, which are formed of SiO$_2$; however, other dielectric materials can also be used. Isolation regions 402, 404, 406, 408, 410, and 424 serve to divide the top layers of the physical block into five regions; for example, the top layer depicted in FIG. 4B is divided into regions 420, 430, 440, 450, and 460 of which are referred to as sub-blocks. In one embodiment, isolation regions 402 and 424 separate the block 407 from adjacent physical blocks. Thus, isolation regions 402 and 424 may extend down to the substrate. In one embodiment, the isolation regions 404, 406, 408, and 410 only divide the layers used to implement select gates so that NAND strings in different sub-blocks can be independently selected. Referring back to FIG. 4, the IR region may correspond to any of isolation regions 404, 406, 408, or 410. In one example implementation, a bit line only connects to one vertical column/NAND string in each of regions (sub-blocks) 420, 430, 440, 450, and 460. In that implementation, each physical block has twenty rows of active columns and each bit line connects to five rows in each block. In one embodiment, all of the five vertical columns/NAND strings connected to a common bit line are connected to the same word line (or set of word lines); therefore, the system uses the drain side selection lines to choose one (or another subset) of the five to be subjected to a memory operation (program, verify, read, and/or erase).

Although FIG. 4B shows each region (420, 430, 440, 450, 460) having four rows of vertical columns, five regions (420, 430, 440, 450, 460) and twenty rows of vertical columns in a block, those exact numbers are an example implementation. Other embodiments may include more or fewer regions (420, 430, 440, 450, 460) per block, more or fewer rows of vertical columns per region and more or fewer rows of vertical columns per block. FIG. 4B also shows the vertical columns being staggered. In other embodiments, different patterns of staggering can be used. In some embodiments, the vertical columns are not staggered.

Figure 4C:
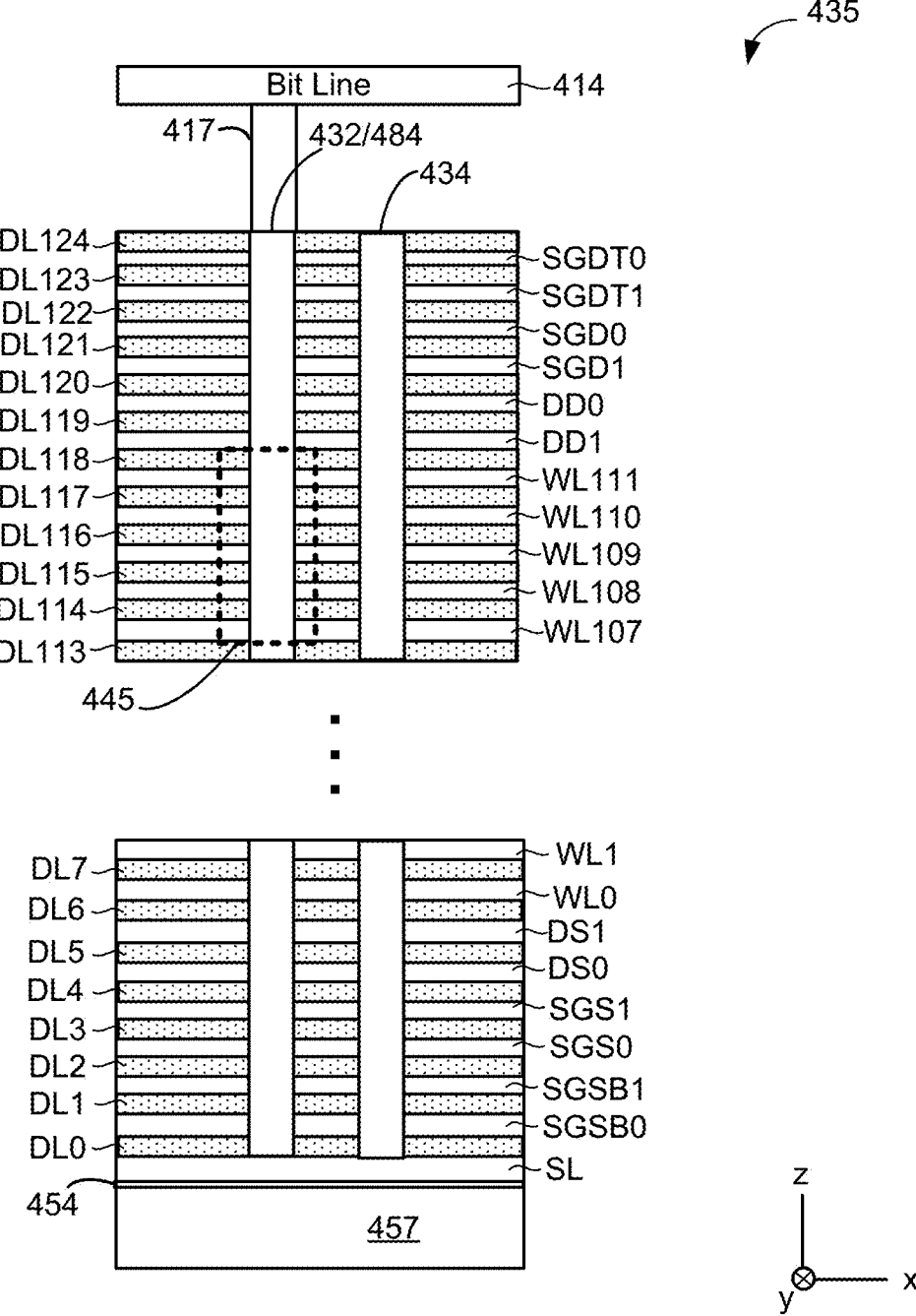
FIG. 4C depicts an example of a stack showing a cross-sectional view along line AA of FIG. 4B.

FIG. 4C depicts an example of a stack 435 showing a cross-sectional view along line AA of FIG. 4B. The SGD layers include SGDT0, SGDT1, SGD0, and SGD1. The SGD layers may have more or fewer than four layers. The SGS layers includes SGSB0, SGSB1, SGS0, and SGS1. The SGS layers may have more or fewer than four layers. Four dummy word line layers DD0, DD1, DS1, and DS0 are provided, in addition to the data word line layers WL0-WL111. There may be more or fewer than 112 data word line layers and more or fewer than four dummy word line layers. Each NAND string has a drain side select gate at the SGD layers. Each NAND string has a source side select gate at the SGS layers. Also depicted are dielectric layers DL0-DL124.

Columns 432, 434 of memory cells are depicted in the multi-layer stack. The stack includes a substrate 457, an insulating film 454 on the substrate, and a portion of a source line SL. A portion of the bit line 414 is also depicted. Note that NAND string 484 is connected to the bit line 414. NAND string 484 has a source-end at a bottom of the stack and a drain-end at a top of the stack. The source-end is connected to the source line SL. A conductive via 417 connects the drain-end of NAND string 484 to the bit line 414.

In one embodiment, the memory cells are arranged in NAND strings. The word line layers WL0-WL111 connect to memory cells (also called data memory cells). Dummy word line layers DD0, DD1, DS0 and DS1 connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Drain side select layers SGD are used to electrically connect and disconnect (or cut off) the channels of respective NAND strings from bit lines. Source side select layers SGS are used to electrically connect and disconnect (or cut off) the channels of respective NAND strings from the source line SL.

Figure 4D:
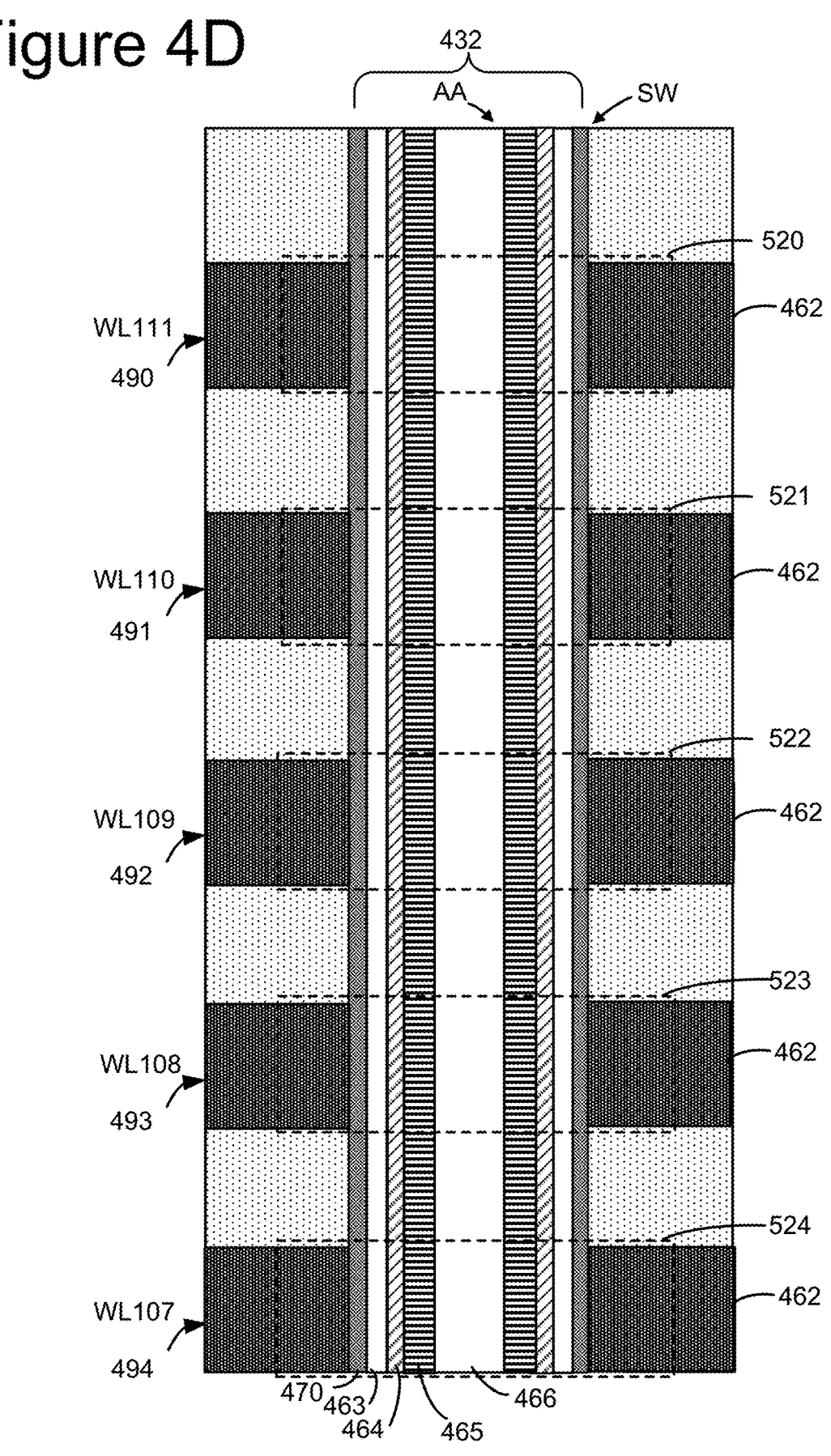
FIG. 4D depicts a view of the region 445 of FIG. 4C.

FIG. 4D depicts a view of the region 445 of FIG. 4C. Data memory cell transistors 520, 521, 522, 523, and 524 are indicated by the dashed lines. A number of layers can be deposited along the sidewall (SW) of the memory hole 432 and/or within each word line layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A word line layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vt of a data memory cell transistor is increased in proportion to the amount of stored charge. During an erase operation, the electrons return to the channel.

Each of the memory holes can be filled with a plurality of annular layers (also referred to as memory film layers) comprising a blocking oxide layer, a charge trapping layer, a tunneling layer and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4E:
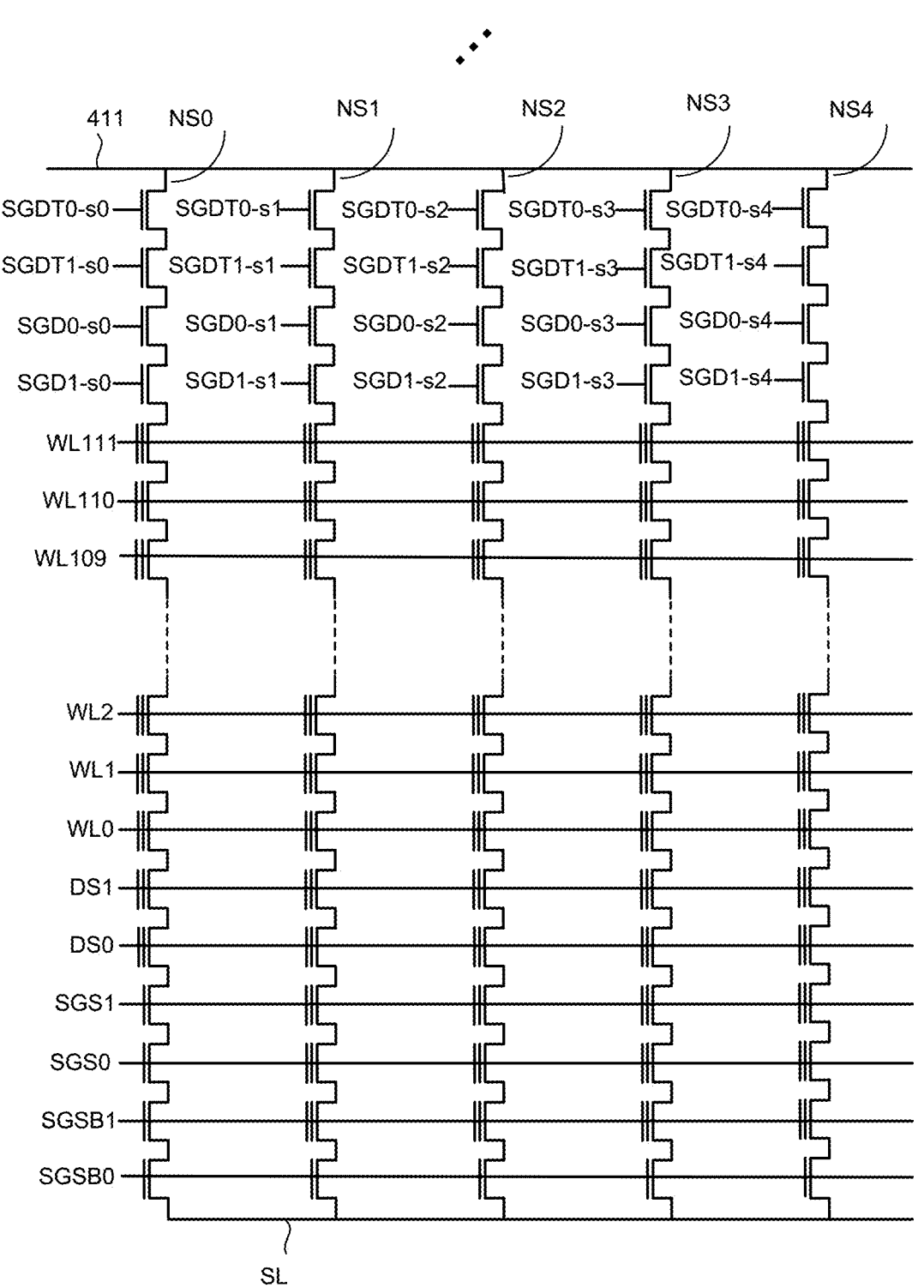
FIG. 4E is a schematic diagram of a portion of one example of a physical block, depicting several NAND strings.

FIG. 4E is a schematic diagram of a portion of the memory array 202. FIG. 4E shows physical data word lines WL0-WL111 running across the entire block. The structure of FIG. 4E corresponds to a portion 407 in Block 2 of FIG. 4A, including bit line 411. Within the physical block, in one embodiment, each bit line is connected to five NAND strings. Thus, FIG. 4E shows bit line 411 connected to NAND string NS0, NAND string NS1, NAND string NS2, NAND string NS3, and NAND string NS4.

In one embodiment, there are five sets of drain side select lines in the physical block. For example, the set of drain side select lines connected to NS0 include SGDT0-*s0*, SGDT1-*s0*, SGD0-*s0*, and SGD1-*s0*. The set of drain side select lines connected to NS1 include SGDT0-*s1*, SGDT1-*s1*, SGD0-*s1*, and SGD1-*s1*. The set of drain side select lines connected to NS2 include SGDT0-*s2*, SGDT1-*s2*, SGD0-*s2*, and SGD1-*s2*. The set of drain side select lines connected to NS3 include SGDT0-*s3*, SGDT1-*s3*, SGD0-*s3*, and SGD1-*s3*. The set of drain side select lines connected to NS4 include SGDT0-*s4*, SGDT1-*s4*, SGD0-*s4*, and SGD1-*s4*. Herein the term "SGD" may be used as a general term to refer to any one or more of the lines in a set of drain side select lines. In an embodiment, each line in a given set may be operated independent from the other lines in that set to allow for different voltages to the gates of the five drain side select transistors on the NAND string. Moreover, each set of drain side select lines can be selected independent of the other sets. Each set drain side select lines connects to a group of NAND strings in the block. Only one NAND string of each group is depicted in FIG. 4E. These five sets of drain side select lines correspond to five sub-blocks. A first sub-block corresponds to those vertical NAND strings controlled by SGDT0-*s0*, SGDT1-*s0*, SGD0-*s0*, and SGD1-*s0*. A second sub-block corresponds to those vertical NAND strings controlled by SGDT0-*s1*, SGDT1-*s1*, SGD0-*s1*, and SGD1-*s1*. A third sub-block corresponds to those vertical NAND strings controlled by SGDT0-*s2*, SGDT1-*s2*, SGD0-*s2*, and SGD1-*s2*. A fourth sub-block corresponds to those vertical NAND strings controlled by SGDT0-*s3*, SGDT1-*s3*, SGD0-*s3*, and SGD1-*s3*. A fifth sub-block corresponds to those vertical NAND strings controlled by SGDT0-*s4*, SGDT1-*s4*, SGD0-*s4*, and SGD1-*s4*. As noted, FIG. 4E only shows the NAND strings connected to bit line 411. However, a full schematic of the block would show every bit line and five vertical NAND strings connected to each bit line.

In one embodiment, all of the memory cells on the NAND strings in a physical block are erased as a unit. However in some embodiments, a physical block is operated as an upper tier and a lower tier, wherein the upper tier and the lower tier each form an erase block. For example, memory cells connected to WL0-WL61 may be in the lower tier and memory cells connected to WL62-WL111 may be in the upper tier. Hence, memory cells connected to WL0-WL61 may be in one erase block and memory cells connected to WL62-WL111 may be in another erase block. A physical block could be operated in more than two tiers. Erase blocks can be formed based on other divisions of physical blocks.

Although the example memories of FIGS. 4-4E are three dimensional memory structure that includes vertical NAND strings with charge-trapping material, other 3D memory structures can also be used with the technology described herein.

Figure 5:
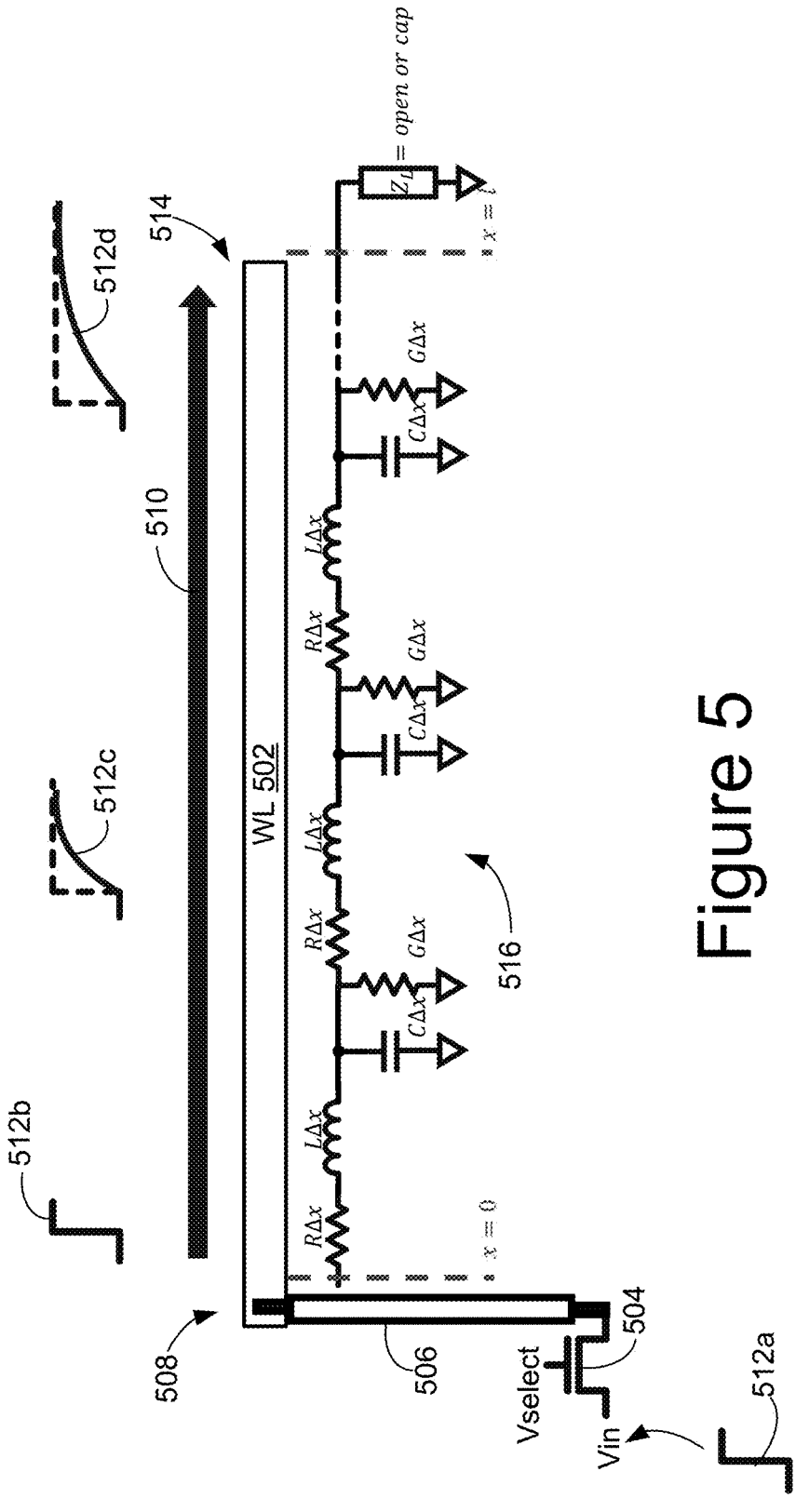
FIG. 5 depicts a word line connected to a word line switch, along with voltage waveforms along the word line.

Embodiments of a memory system that drive even WLs from one end and odd WLs from the opposite end provide for a fast voltage ramp up without the need for extra WL switches. FIG. 5 will now be discussed to illustrate issues with ramping up voltages on word lines. Note that this discussion also applies to other conductive lines such as select lines in a 3D NAND architecture. FIG. 5 depicts a word line connected to a word line switch, along with voltage waveforms along the word line. The word line 502 is connected to the word line switch 504 by electrical pathway 506. The word line switch 504 may also be referred to as a WL driver transistor. The electrical pathway 506 may include vias, metal lines, etc. The word line switch 504 drives the near end 508 of the WL 502. The WL switch 504 is provided with a voltage waveform (Vin) 512a. The voltage waveform 512a might be a programming voltage, read voltage, read pass voltage, etc. When the WL switch 504 is selected with Vselect, the voltage waveform is provided to the near end 508 of the WL 502. Arrow 510 shows the direction of propagation of the voltage waveform 512b, 512c, 512d to the far end 514 of the WL 502. As can be seen voltage waveform 512b at the near end 508 has a rapid ramp up, voltage waveform 512c at the midpoint has a medium ramp up, and voltage waveform 512d at the far end 514 has a slow ramp up. Also depicted is a model 516 of the impedance (Z) along the word line 502. The impedance (Z) is modeled as resistance (R), inductance (L), capacitance (C), and conductance (G).

The resistance (R) may increase if the word line is made thinner to, for example, increase the density of word line lines. Also, the capacitance (C) between word lines may increase if the insulator between word lines is made thinner. Increases in resistance (R) and/or capacitance (C) will result in an increase in the ramp up time (i.e., slow the voltage ramp up) at the far end 514 of the WL 502. Therefore, memory operations such as read and write can potentially take longer with increases in resistance (R) and/or capacitance (C) of the word lines. Therefore, if the pitch of the WL/dielectric is reduced memory operations can potentially take more time to complete.

Figure 6:
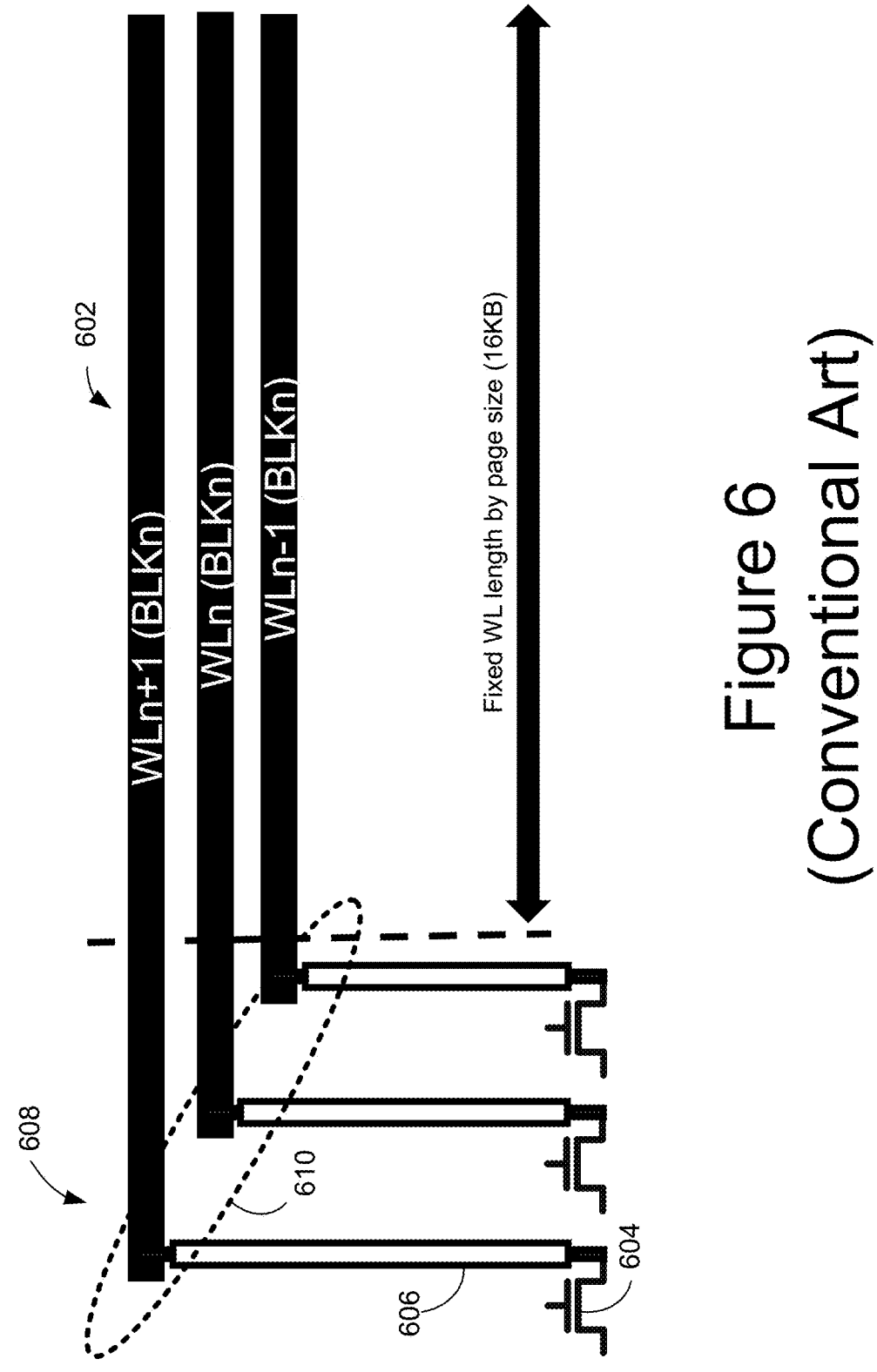
FIG. 6 is one example of a conventional technique for driving a set of adjacent word lines in a block.

FIG. 6 is one example of a conventional technique for driving a set of adjacent word lines in a block. The word lines 602 are labeled WLn−1, WLn, and WLn+1 to indicate that the word lines are adjacent to each other and thereby there will be capacitive coupling between the word lines. Three of the word lines 602 of the block are depicted, but there may be many more word lines in the block such that Wn−1 and Wn+1 may also have a neighbor word line. The word lines in FIG. 6 could be in a 3D NAND architecture such as the example 3D NAND architecture in FIG. 4. For the sake of example, the WL length corresponds to a page (e.g., 16 KB). That is, reading or programming the memory cells connected to a WL will read or program one page of memory cells. The page size will vary depending on implementation. However, a larger page size is often preferable, which presents challenges to the design of 3D memory systems. Each word line 602 is driven at the near end 608 by a word line switch 604. Electrical pathways 606 connect the word line switches 604 to their respective word line 602. The connections to the WLs are made in what is referred to herein as a staircase 610, which is a region in which the ends of the WLs are staggered to allow electrical connections by way of pillars or the like in the electrical pathways 606. The conventional technique depicted in FIG. 6 may suffer from slow voltage ramp up times at the far ends of the word lines.

Figure 7:
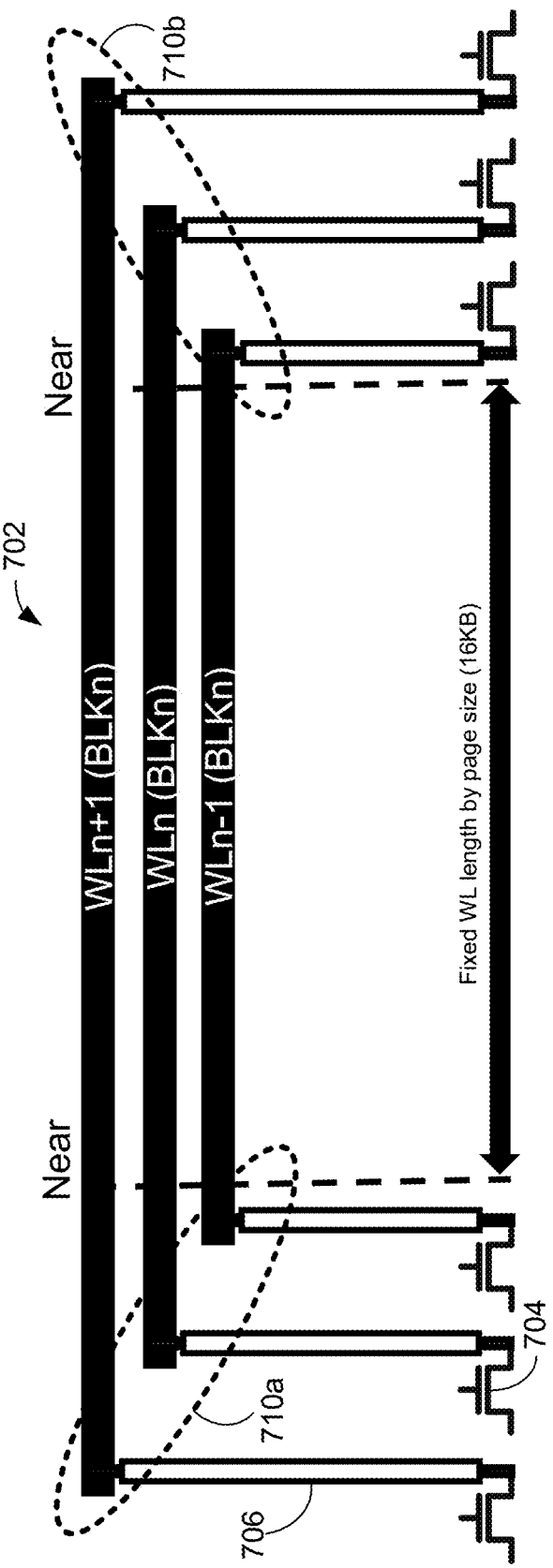
FIG. 7 is another example of a conventional technique for driving a set of adjacent word lines in a block.

FIG. 7 is another example of a conventional technique for driving a set of adjacent word lines in a block. Each word line 702 is driven at two ends. Thus, each word line 702 is connected to two word line switches 704. Electrical pathways 706 connect the word line switches 704 to their respective word line 702. Assuming that the WL length in the example of FIG. 7 is the same as that of FIG. 6 to accommodate the same page size, the conventional technique in FIG. 7 is able to improve the ramp up time of the voltage driven on the word lines relative to the conventional technique in FIG. 6. However, the conventional technique in FIG. 7 needs to double the number of word line switches 704 relative to the conventional technique in FIG. 6. The doubling of the WL switches 704 requires additional area for the additional WL switches 704. The conventional architecture in FIG. 7 has two staircases 710a, 710b to allow the electrical connections to the WL switches. Therefore, the conventional architecture in FIG. 7 essentially doubles the area needed for staircases relative to the conventional architecture in FIG. 6. Note that the staircase region is not used for memory cells.

Figure 8:
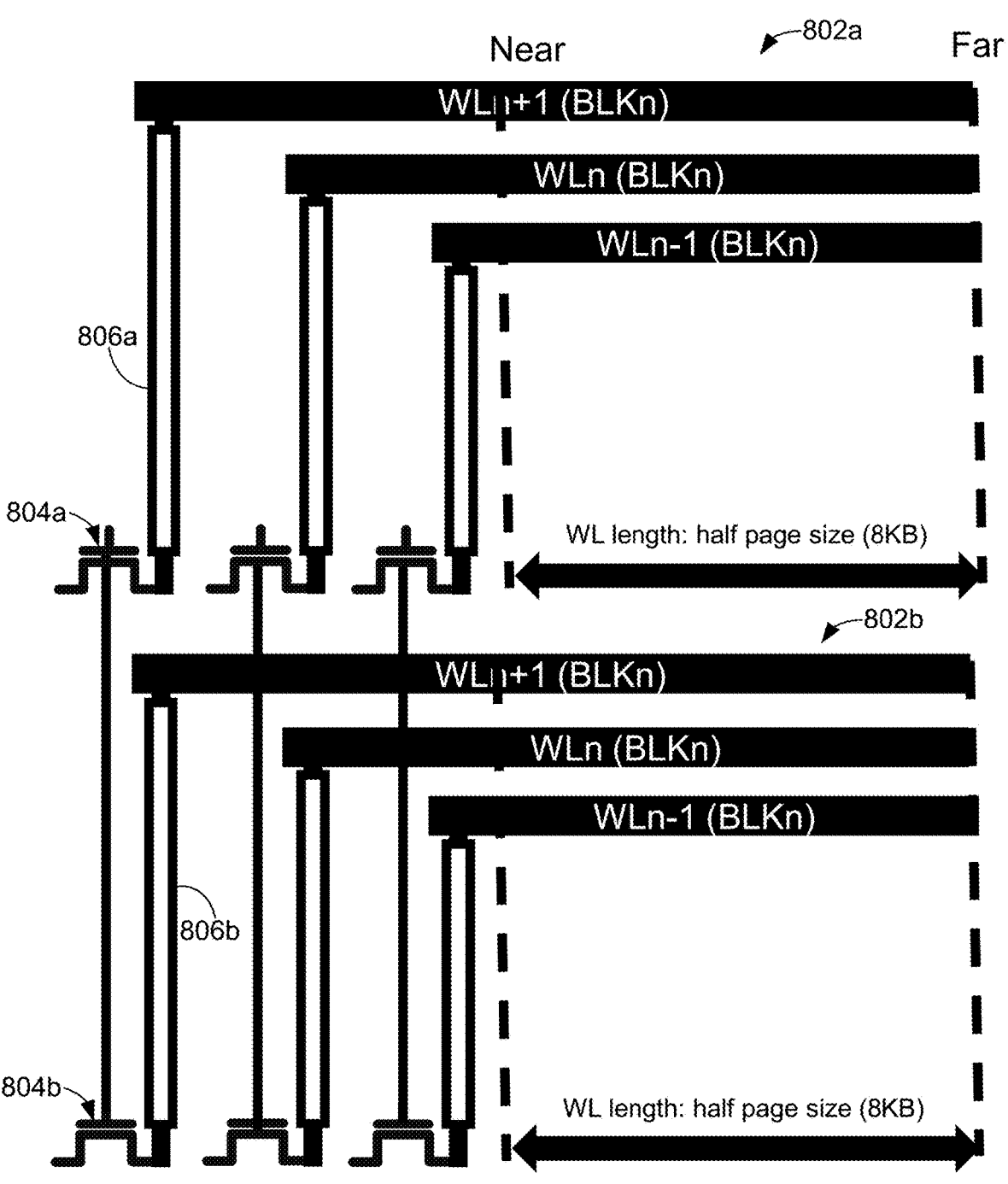
FIG. 8 is an example of still another conventional technique for driving a set of adjacent word lines in a block.

FIG. 8 is an example of still another conventional technique for driving a set of adjacent word lines in a block. In the conventional technique of FIG. 8, the word lines 802 have half the length of the word lines in the conventional architecture of FIGS. 6 and 7. Note, however, that there are two "segments" 802a, 802b for each word in the conventional technique in FIG. 8. For example, there are two segments for WLn−1, two segments for WLn, and two segments for WLn+1. Each WL segment has a length that is adapted for a half a page (8 KB). A block may contain two WL segments for each WL in order to result in a 16 KB page size for the block. Thus, the same 16 KB page size may be used for memory operations as in the examples in FIGS. 6 and 7. However, each WL segment is driven by its own word line switch. Thus, there are two set of word line switches 804a, 804b for the block. The shorter WL segments help to improve word line ramp up time at the far end of the WL segments. However, as with the example in FIG. 7, twice as many word line switches 804a, 804b are needed for the block (given the same page size for the block) relative to the conventional technique of FIG. 6. Also, two staircases are needed in the conventional architecture of FIG. 8, thereby leading to doubling the area needed for the connections to the WLs relative to the conventional architecture of FIG. 6.

Figure 9:
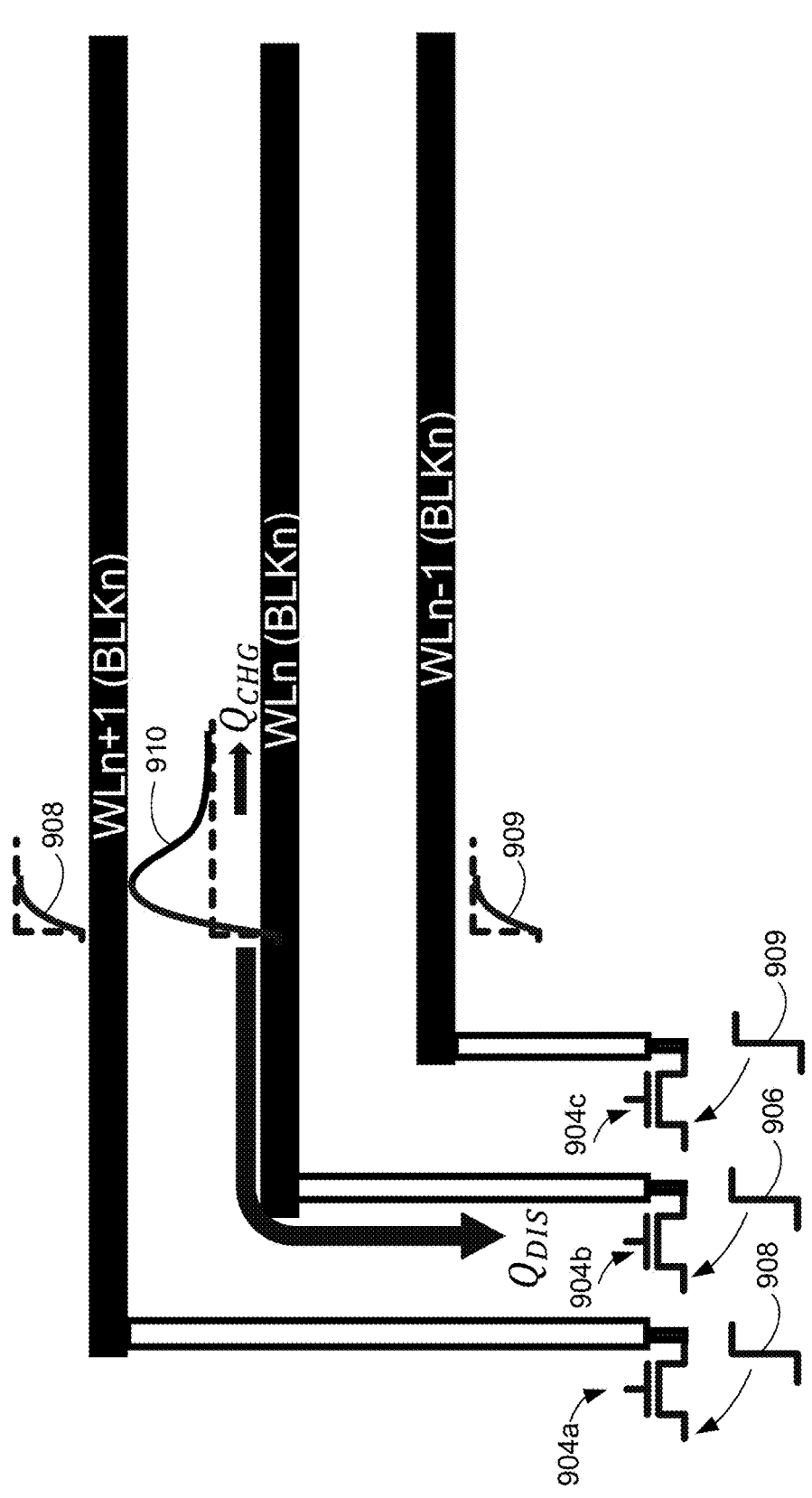
FIG. 9 depicts problems associated with slow ramp up times for a conventional technique in which word lines are driven from the same side.

Another conventional technique that may be used to help increase ramp up time is referred to as "coupling assist." The coupling assist may be used to decrease ramp up time. In general, the conventional coupling assist technique takes advantage of the capacitive coupling between adjacent word lines and a target word line to improve the ramp up of the target word line voltage. For example while a programming voltage is applied to the target word line (WLn) voltages are applied to the adjacent word lines (WLn−1, WLn+1). Due to capacitive coupling between the adjacent word lines and the target word the ramp up time of the programming voltage on the target word line can be reduced. However, this conventional coupling assist technique may be inefficient. FIG. 9 depicts problems associated with a conventional coupling assist technique. WL driver transistor 904b is providing voltage waveform 906 to the near end of WLn. WL driver transistor 904a is providing voltage waveform 908 to the near end of WLn+1. WL driver transistor 904c is providing voltage waveform 909 to the near end of WLn−1. The voltage waveforms 908, 909 on WLn+1 and WLn−1 help to couple up the voltage on WLn, resulting in voltage waveform 910 on the near end of WLn. This results in Qchg at the near end of WLn, which can help to speed the ramp up at the far end of WLn. However, there is a discharge Qdis back to the WL driver transistor 904b due to the voltage waveform 906 being smaller in magnitude than the peak magnitude of voltage waveform 910. Therefore, current is wasted. Also, if the voltage waveform 910 is too high WL driver transistor 904b may be damaged. Therefore, the magnitude of the overshoot of voltage waveform 910 needs to be kept within a tolerance, thereby reducing the amount of Qchg that can be generated.

Figure 10:
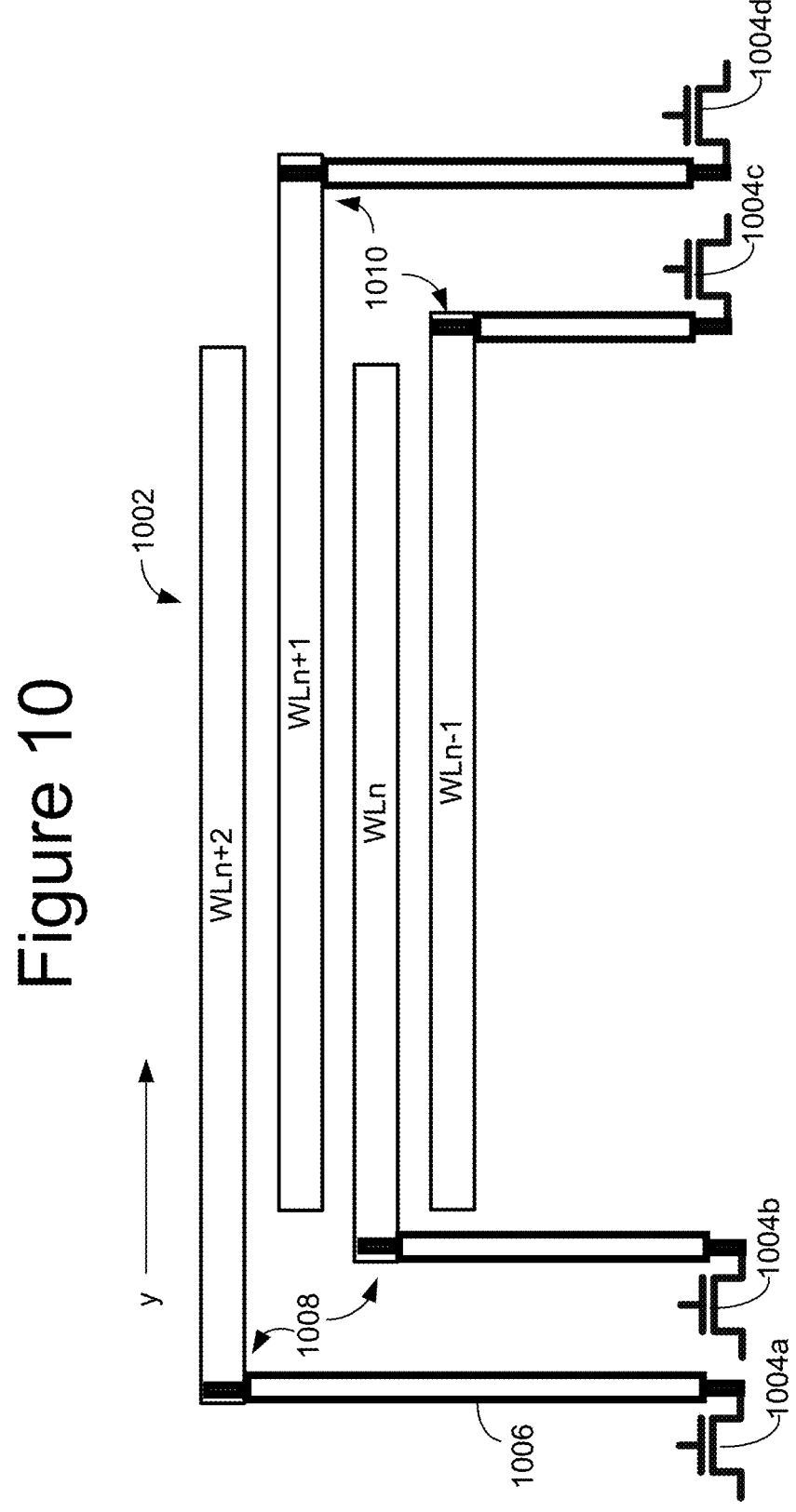
FIG. 10 depicts one embodiment of connections between word line switches and word lines.

FIG. 10 depicts one embodiment of connections between word line switches and word lines. An embodiment of the architecture depicted in FIG. 10 has a fast ramp up at the far end of the word line. Moreover, the fast ramp up is achieved without resorting to use of additional WL driver transistors. Also, in embodiments, the staircase region need not be increased significantly. Four word lines 1002 (WLn−1, WLn, WLn+2, WLn+2) in a block are depicted. There may be many other word lines in the block. In an embodiment, the word lines 1002 are in a multi-layer stack such as stack 435 (See FIG. 4C). As noted above, the stack 435 may have alternating conductive and dielectric layers. Each word line 1002 is connected to a word line switch 1004. Each word line has a first end on the left and a second end on the right. Two of the word lines (WLn, WLn+2) are driven at their respective first ends 1008. Two of the word lines (WLn−1, WLn+1) are driven at their respective second ends 1010. Specifically, WLn+2 is driven at first end 1008 by WL switch 1004a, WLn is driven at first end 1008 by WL switch 1004, WLn−1 is driven at second end 1010 by WL switch 1004c, and WLn+1 is driven at second end 1010 by WL switch 1004d. The word lines may be numbered sequentially such that the even numbered word lines are driven at one end and the odd numbered word lines are driven at the opposite ends. Note that the WL switches 1004 are one embodiment of even/odd WL drivers (see, for example, 132 in FIGS. 1, 2A, 2B). The word lines extend in a y-direction. The configuration of FIG. 10 provides voltages to different physical locations in the y-direction along the odd word line than the even word lines.

Figure 11:
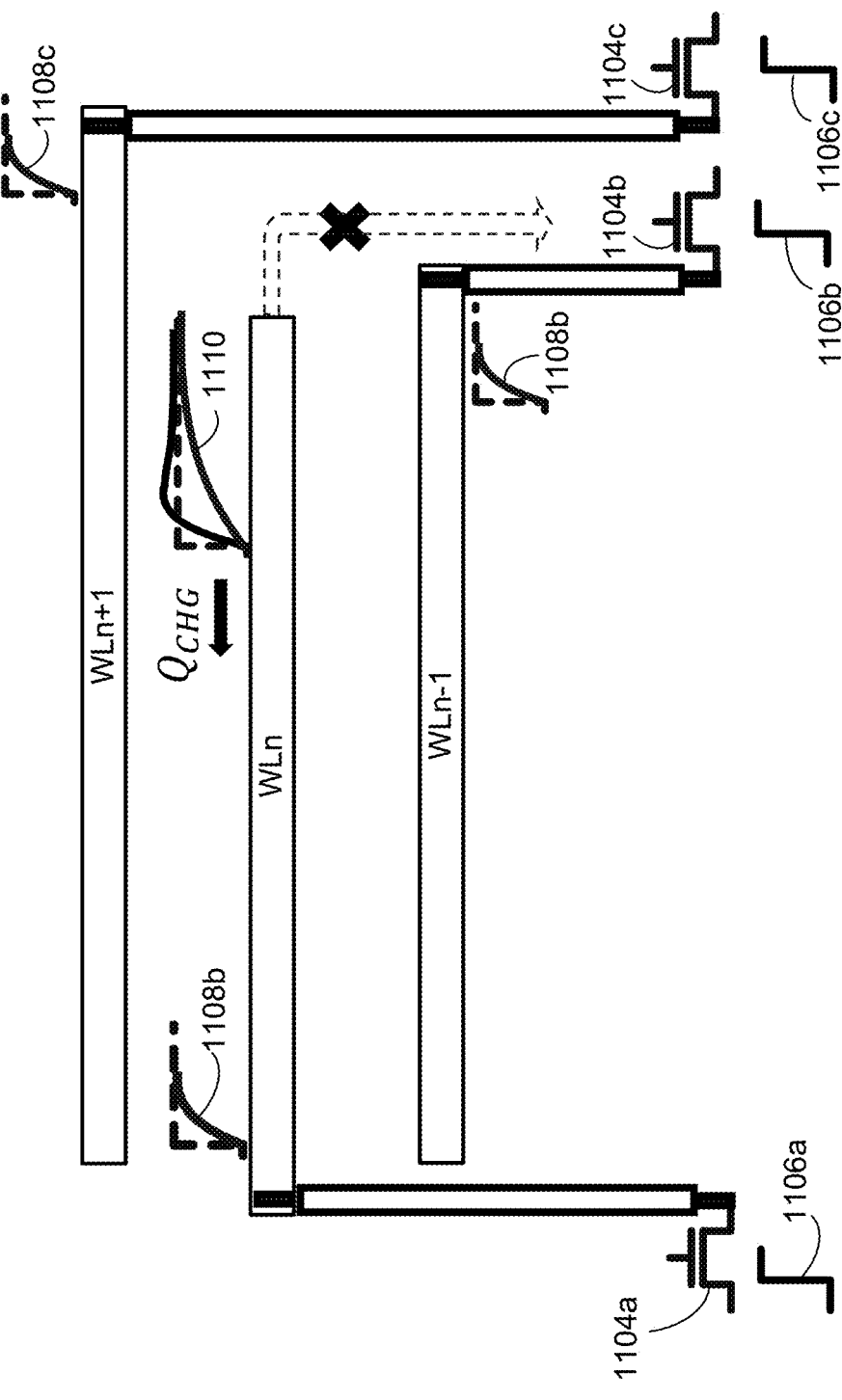
FIG. 11 is a diagram illustrating improved coupling in an embodiment of driving even and odd word lines from opposite ends.

FIG. 11 is a diagram illustrating improved coupling in an embodiment of driving even and odd word lines from opposite ends. WL driver transistor 1104a is providing voltage waveform 1106a to the near end of WLn. WL driver transistor 1104b is providing voltage waveform 1106b to the near end of WLn−1. WL driver transistor 1104c is providing voltage waveform 1106c to the near end of WLn+1. Voltage waveform 1108b results at the near and of WLn−1 and voltage waveform 1108c results at the near and of WLn+1. Capacitive coupling between WLn−1 and WLn and between WLn+1 and WLn helps to boost the voltage at the far end of WLn, resulting in voltage waveform 1110 at the far end of WLn. Voltage waveform 1110 may have some overshoot, which thereby may result in Qchg on WLn. The Qchg results in the overall improvement of voltage rampup time on WLn. However, since there is not a WL drive transistor connected to the far end of WLn, there is no Qdis (as in the example in FIG. 9). Note that the aforementioned improvements in rampup time for WLn also applies to other word lines, as other word lines will also have neighbors in a similar configuration as WLn to its neighbors. Therefore, other word lines also benefit from capacitive coupling at their far ends to neighbors being driven at the neighbor's near ends. A further benefit is that the amount of overshoot of voltage waveform 1110 can be made higher without danger of damaging a WL transistor because there is not a WL transistor connected to the far end of WLn.

FIG. 12 depicts an example of a conventional floorplan 1200 that includes peripheral circuits 1202 and word line switches 1204, 1206 for one plane. The circuits in the conventional floorplan 1200 may be used to drive all of the word lines in a block from the same end, as in the conventional example of FIG. 6. The floorplan 1200 does not depict the memory structure; however, the memory structure that corresponds to the floorplan will have n+1 blocks. The peripheral circuits 1202 may include sense amplifiers, bit line drivers, column decoders, row decoders, etc. The WL switches 1204 for even blocks are to one side of the peripheral circuits 1202 and the WL switches 1206 for odd blocks are to the other side of the peripheral circuits 1202. Thus, for example, both the even (E) and odd (O) word lines for block 0 are driven from the left side and both the even (E) and odd (O) word lines for block 1 are driven from the right side.

FIG. 13 depicts another embodiment of a floorplan 1300 for control circuits for one plane. In one embodiment, the control circuits represented in the floorplan 1300 reside on a control die 211 (or CMOS die). In one embodiment, the control circuits represented in the floorplan 1300 reside on a memory die 200 in a circuit under array (CuA) architecture. The floorplan 1300 does not depict the memory structure; however, the memory structure that corresponds to the floorplan 1300 will have M blocks (Blk 0 to Blk M−1). The peripheral circuits 1302 may include sense amplifiers (e.g., sense amp 230, FIG. 2A or 2B), bit line drivers (e.g. driver circuitry 214, FIG. 2A or 2B), column decoders (e.g., column decoder 212, FIG. 2A or 2B), row decoders (e.g., row decoder 222, FIG. 2A or 2B), block select (e.g., block select 216, FIG. 2A or 2B), system control logic (e.g., all or a portion of system control logic 260, FIG. 2A or 2B). The WL switches 1304 for even WLs of even blocks and Even WLs of odd blocks are to one side of the peripheral circuits 1302. The WL switches 1306 for odd WLs of even blocks and odd WLs of odd blocks are to the other side of the peripheral circuits 1302. This configuration may be used to drive odd numbered word lines in a selected block from one end of the word lines while driving even numbered word lines in the selected block from the other end of the word lines. Therefore, this floorplan 1300 is one embodiment for driving word lines as depicted in FIG. 10.

FIG. 14 depicts one embodiment of a floorplan 1400 for control circuits for one plane. In one embodiment, the control circuits represented in the floorplan 1400 reside on a control die 211 (or CMOS die). In one embodiment, the control circuits represented in the floorplan 1400 reside on a memory die 200 in a circuit under array (CuA) architecture. The floorplan 1400 does not depict the memory structure; however, the memory structure that corresponds to the floorplan 1400 will have M blocks (Blk 0 to Blk M–1). The peripheral circuits 1402 may include sense amplifiers (e.g., sense amp 230, FIG. 2A or 2B), bit line drivers (e.g. driver circuitry 214, FIG. 2A or 2B), column decoders (e.g., column decoder 212, FIG. 2A or 2B), row decoders (e.g., row decoder 222, FIG. 2A or 2B), block select (e.g., block select 216, FIG. 2A or 2B), system control logic (e.g., all or a portion of system control logic 260, FIG. 2A or 2B). The WL switches 1404 for odd WLs of even blocks and Even WLs of odd blocks are to one side of the peripheral circuits 1402. The WL switches 1406 for even WLs of even blocks and odd WLs of odd blocks are to the other side of the peripheral circuits 1402. This configuration may be used to drive odd numbered word lines in a selected block from one end of the word lines while driving even numbered word lines in the selected block from the other end of the word lines. Therefore, this floorplan 1400 is one embodiment for driving word lines as depicted in FIG. 10.

FIG. 15 depicts an example of a conventional floorplan 1500 that includes peripheral circuits 1502 and word line switches 1504 for one plane. The floorplan 1500 may be used in what is referred to as a "mid-plane" or "mid-array" architecture. The floorplan 1500 does not depict the memory structure; however, the memory structure that corresponds to the floorplan 1500 will have n blocks (blk0 to blkn–1). Each word line may actually have two segments, such as the example in FIG. 8. The circuits in the conventional floorplan 1500 may be used to drive all of the word lines in a block from the same end, as in the conventional example of FIG. 8. The peripheral circuits 1502 are divided into two portions 1502a, 1502b.

FIG. 16 depicts one embodiment of a floorplan 1600 that includes peripheral circuits and word line switches for one plane. The floorplan 1600 may be used in what is referred to as a "mid-plane" or "mid-array" architecture. The floorplan 1600 does not depict the memory structure; however, the memory structure that corresponds to the floorplan 1600 will have M blocks (blk0 to blkm–1). The memory array may be divided into two regions. One memory array region may roughly correspond to peripheral region 1602a and the other memory array region may roughly correspond to peripheral region 1602b. The peripheral circuits 1602a, 1602b may include sense amplifiers (e.g., sense amp 230, FIG. 2A or 2B), bit line drivers (e.g. driver circuitry 214, FIG. 2A or 2B), column decoders (e.g., column decoder 212, FIG. 2A or 2B), row decoders (e.g., row decoder 222, FIG. 2A or 2B), block select (e.g., block select 216, FIG. 2A or 2B), system control logic (e.g., all or a portion of system control logic 260, FIG. 2A or 2B).

In the floorplan 1600, the WL switches 1606 for even WLs of all blocks are in the mid-point of the floorplan 1600. These WL switches 1606 may be used to drive both memory array regions of the even word lines of all blocks. The WL switches 1604 for one memory array region of the odd WLs of all blocks are located outside of peripheral region 1602a. The WL switches 1608 for the other memory array region of the odd WLs of all blocks are located outside of peripheral region 1602b. This configuration may be used to drive odd numbered word lines in a selected block from both ends of the word lines while driving even numbered word lines in the selected block from a midpoint of the word lines. Therefore, this configuration provides voltages to different physical locations along the odd word line than the even word lines.

Figure 17:
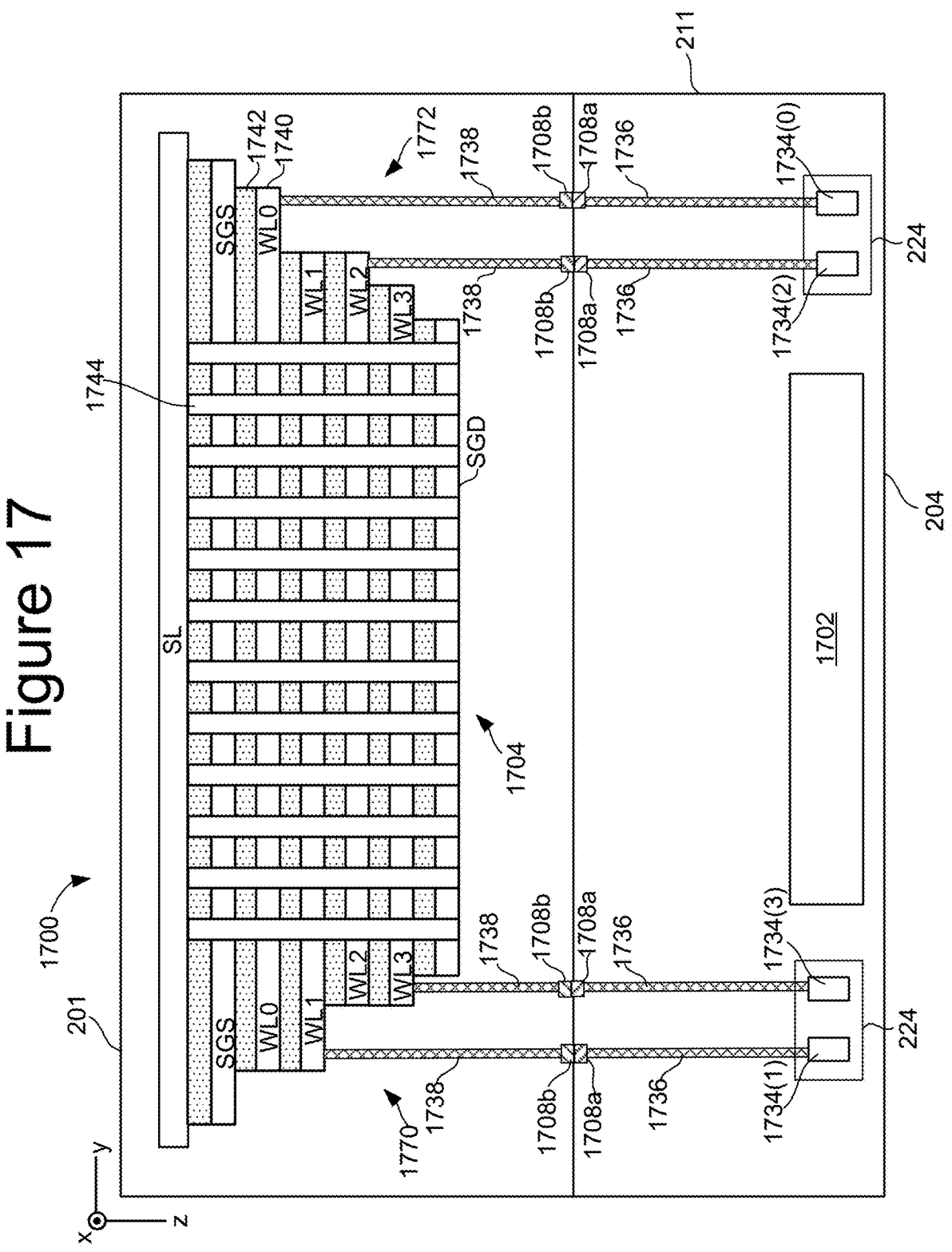
FIG. 17 is a cross-sectional view of one embodiment of a memory device configured to drive even numbered word lines in a selected block from one end while driving odd numbered word lines in the selected block from the other end.

FIG. 17 is a cross-sectional view of one embodiment of a memory device 1700 configured to drive even numbered word lines in a selected block from one end of the WLs while driving odd numbered word lines in the selected block from the other end of the WLs. The memory device 1700 includes a memory array die 201 and a control die 211. The memory array die 201 contains the word lines and the memory cells. The control die 211 contains control circuits including, but not limited to, word line drivers 224 and peripheral circuitry 1702. The memory structure 1704 depicted on the memory array die 201 has alternating conductive layers and dielectric layers adjacent to a source line (SL). In this simplified example, the conductive layers include source side selected line (SGS), word lines (WL0, WL1, WL2, WL3) and a drain side select line (SGD). The conductive layers extend in the y-direction. There will typically be many more word lines. Also the SGS and SGD may each have multiple conductive layers. NAND strings 1744 extend vertically (z-direction) through the memory structure 1704. The bit lines are not depicted in FIG. 17 but may extend in the x-direction adjacent to the SGD. The memory structure 1704 in FIG. 17 is a simplified example of a 3D NAND structure, further details of which are depicted in FIGS. 4, 4B, 4C, 4D, and 4E. The word lines have a first end 1770 and a second end 1772. The first ends 1770 of the word lines form what is referred to herein as a "staircase". Likewise, the second ends 1772 of the word lines form what is referred to herein as a "staircase". The staircase results from the lower numbered word lines being longer than higher numbered word lines.

The control die 211 has word line drivers 224 that include WL switches 1734. WL switch 1734(1) is connected to and drives WL1 from the first end 1770. WL switch 1734(3) is connected to and drives WL3 from the first end 1770. WL switch 1734(0) is connected to and drives WL0 from the second end 1772. WL switch 1734(2) is connected to and drives WL2 from the second end 1772. Therefore, the odd word lines are driven from first end 1770 and the even word lines are driven from the second end 1772. Therefore, the configuration in FIG. 17 is one implementation of the system depicted in FIG. 10.

In FIG. 17 the control die 211 is bonded to the memory array die 201. A first set of bond pads 1708a on the control die 211 are bonded to a second set of bond pads 1708b on the memory array die 201. A first set of electrical paths 1736 on the control die 211 connect the WL switches 1734 to the first set of bond pads 1708a. A second set of electrical paths 1738 on the memory array die 201 connect the WLs to the second set of bond pads 1708b. The depiction of the electrical paths 1736, 1738 is simplified. The electrical paths 1736, 1738 may each have vias, metal lines, etc. Vias may run vertically (z-direction) and metal paths may run horizontally (x-direction, and/or y-direction).

The staircases allow for a pillar or the like in electrical pathways 1738 to connect to the respective word lines. Note that because only half of the word lines are driven from each end the staircase can be simplified relative to an architecture that requires all word lines to be driven from the same end. For example, at the first end 1770 WL0 need not extend past WL1, as no connection to WL0 is needed at the first end 1770. This opens up the potential to reduce the y-direction width of a staircase.

As noted, FIG. 17 depicts a cross-section of one block. The configuration depicted in FIG. 17 may be used to implement both even blocks and odd blocks in an embodiment of the floorplan 1300 in FIG. 13. In one embodiment, the configuration depicted in FIG. 17 may be used to implement odd blocks in an embodiment of the floorplan 1400 in FIG. 14. The configuration depicted in FIG. 17 may be reversed to implement even blocks in the floorplan 1400 in FIG. 14. Furthermore note that an advantage of the floorplan 1300 in FIG. 13 is that it enables a simpler fabrication process due to the simplified staircases (half as many steps) and the same staircase configuration for each block. Note that FIG. 17 depicts one configuration for driving even numbered word lines and odd numbered word line from different points in the y-direction along the even/odd word lines.

Figure 18A:
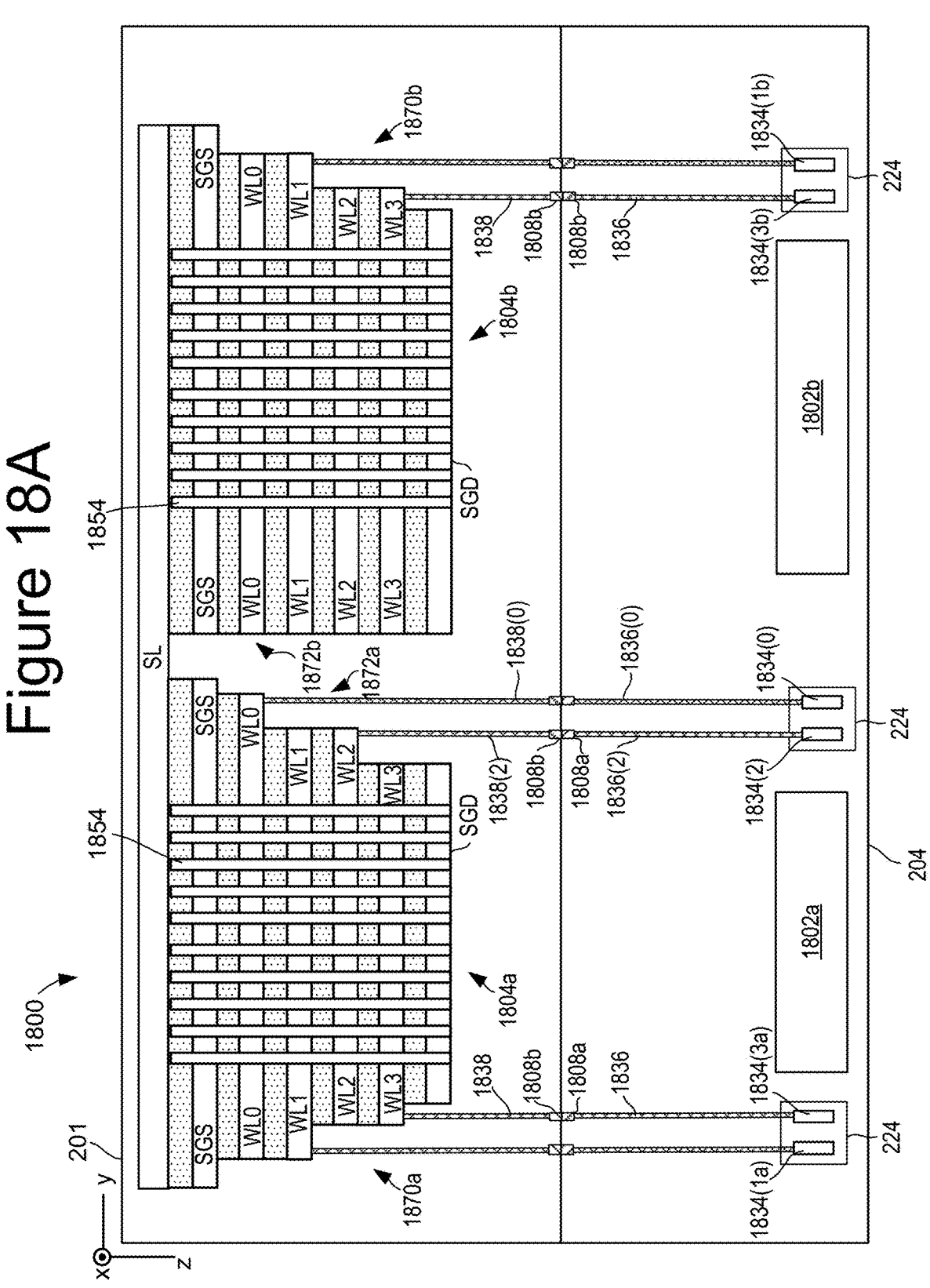
FIG. 18A is a cross-sectional view of one embodiment of a memory device configured to drive even numbered word line segments in a selected block from one end while driving odd numbered word line segments in the selected block from the other end.

FIG. 18A is a cross-sectional view of one embodiment of a memory device 1800 configured to drive even numbered word lines and odd numbered word line from different points in the y-direction along the even/odd word lines. In an embodiment, even word lines are driven from a y-direction midpoint of the word lines and odd word lines are driven from each end of the word line (relative to y-direction). However, the driving of the even and odd word lines could be reversed. For the sake of discussion, each word line could be described as having two segments with even numbered segments in a selected block driven from one end of the segment while driving odd numbered word line segments in the selected block from the other end of the segment. The memory device 1800 includes a memory array die 201 and a control die 211. The memory array die 201 contains the word lines and the memory cells. In the architecture depicted in FIG. 18, a cross-section of one block of memory cells is depicted. The block is divided into two portions having a first memory array region 1804a and a second memory array region 1804b. Each memory array region 1804a, 1804a contains alternating conductive layers and dielectric layers adjacent to a source line (SL). Also, each memory array region 1804a, 1804b contains a number of NAND strings 1854. The SL is depicted as having one segment, but could have two segments. In this simplified example, the conductive layers for each stack 1804a, 1804b include a source side select line (SGS), word lines (WL0, WL1, WL2, WL3) and a drain side select line (SGD). There will typically be many more word lines. Also the SGS and SGD may each have multiple conductive layers. NAND strings 1854 extend vertically (z-direction) through each memory array region 1804a, 1804b. The bit lines are not depicted in FIG. 18 but may extend in the x-direction adjacent to each SGD. The memory array regions 1804a, 1804b in FIG. 18 are a simplified example of a 3D NAND structure, further details of which are depicted in FIGS. 4, 4B, 4C, 4D, and 4E. The word line segments in memory array region 1804a have a first end 1870a and a second end 1872a. The word line segments in region 1804b have a first end 1870b and a second end 1872b. The first ends 1870a of the word lines in region 1804a form a "staircase". The second ends 1872a of the word line segments in region 1804a form a "staircase". In the embodiment depicted in FIG. 18A, there is a single staircase at mid-array. The first ends 1870b of the word lines in stack 1804b form a "staircase".

The control die 211 contains control circuits including, but not limited to, word line drivers 224 and peripheral circuitry 1802a, 1802b. The control die 211 has word line drivers 224 that include WL switches 1834. WL switch 1834(1a) is connected to and drives WL1 in region 1804a from the first end 1870a. WL switch 1834(3a) is connected to and drives WL3 in region 1804a from the first end 1870a. WL switch 1834(0) is connected to and drives WL0 from a midpoint 1872a (relative to y-direction). WL switch 1834(2) is connected to and drives WL2 from a midpoint 1872a. Therefore, the odd word lines in stack 1804a are driven from first end 1870a and the even word lines in region 1804a are driven from a midpoint. In a similar manner, WL switch

1834(1b) is connected to and drives WL1 in stack 1804b from the first end 1870b; WL switch 1834(3b) is connected to and drives WL3 in stack 1804b from the first end 1870b.

In FIG. 18A the control die 211 is bonded to the memory array die 201. A first set of bond pads 1808a on the control die 211 are bonded to a second set of bond pads 1808b on the memory array die 201. A first set of electrical paths 1836 on the control die 211 connect the WL switches 1834 to the first set of bond pads 1808a. A second set of electrical paths 1838 on the memory array die 201 connect the WLs to the second set of bond pads 1808b. The depiction of the electrical paths 1836, 1838 is simplified. The electrical paths 1836, 1838 may each have vias, metal lines, etc. Vias may run vertically (z-direction) and metal paths may run horizontally (x-direction, and/or y-direction).

The staircases in FIG. 18A allow for a pillar or the like in electrical pathways 1838 to connect to the respective word lines. Note that because only half of the word lines are driven from a given point in the y-direction along the word lines, the staircase can be simplified relative to an architecture that requires all word lines to be driven from the same end. For example, at the first end 1870a of stack 1804a, WL0 need not extend past WL1, as no connection to WL0 is needed at the first end 1870a in stack 1804a. This opens up the potential to reduce the y-direction width of a staircase.

Figure 18B:
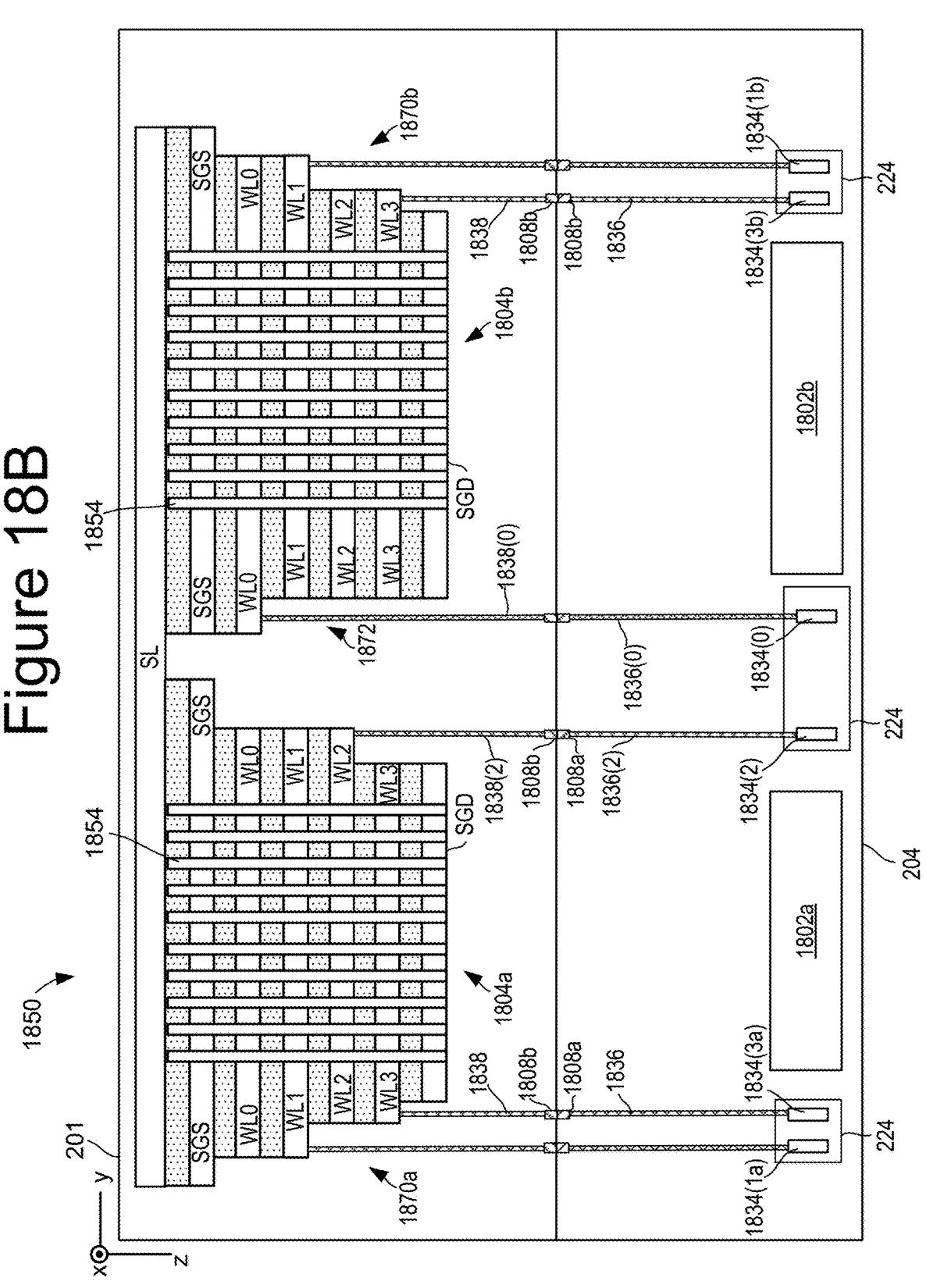
FIG. 18B is a cross-sectional view of another embodiment of a memory device 1850 configured to drive even numbered word lines and odd numbered word line from different points along the even/odd word lines.

FIG. 18B is a cross-sectional view of another embodiment of a memory device 1850 configured to drive even numbered word lines and odd numbered word line from different points in the y-direction along the even/odd word lines. The configuration in FIG. 18B is similar to that of FIG. 18A, with a difference being in how the even word lines are driven. In FIG. 18B there are two staircases at mid-array. Typically, there will be many more word lines. In an embodiment, one mid-array staircase has the connection points for WL0, WL4, WL8, etc. The other mid-array staircase has the connection points for WL2, WL6, WL10, etc.

FIGS. 17, 18A and 18B depict embodiments in which the WL drivers are located on a separate die from the word lines, which is consistent with the embodiment of FIG. 2B. However, in another embodiment, the WL drivers are located on the same die as the word lines, which is consistent with the embodiment of FIG. 2A.

Figure 18C:
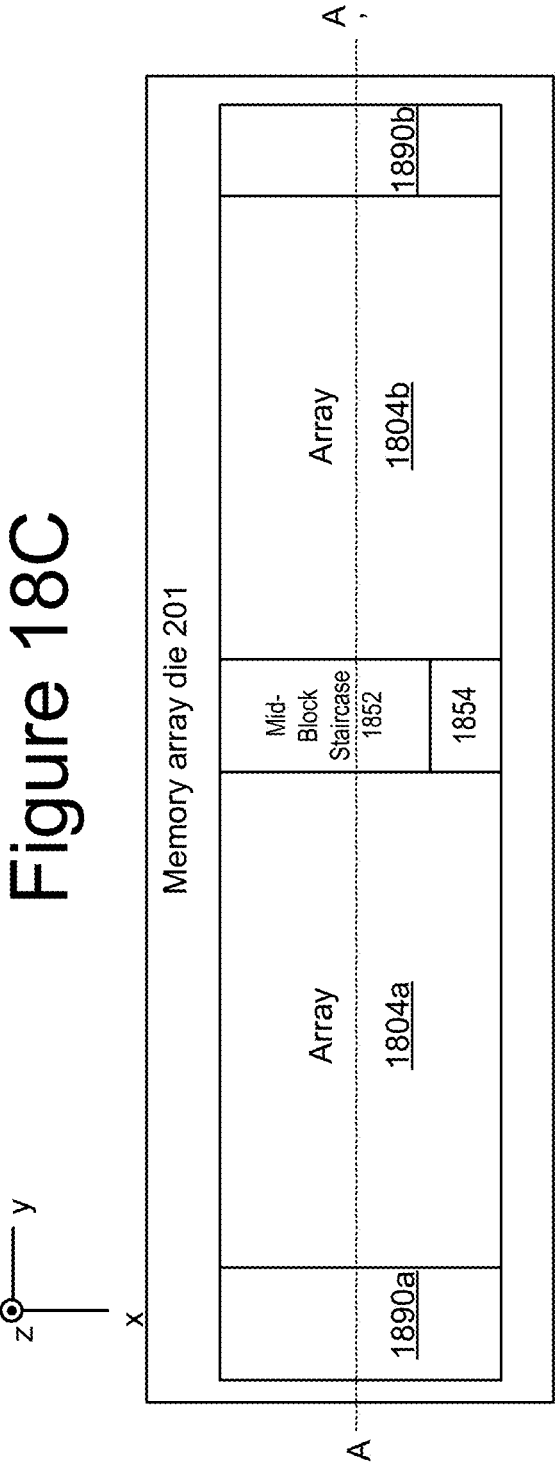
FIG. 18C depicts a view of layout for an embodiment of a memory die in which half of the word lines are driven from the mid-array.

FIG. 18C depicts a view of layout for an embodiment of a memory die in which half of the word lines are driven from the mid-array. FIG. 18C provides details of a layout for the memory die for either FIG. 18A or 18B. Note that FIG. 18A is one embodiment of a cross-section along line A-A' in FIG. 18C. FIG. 18B is another embodiment of a cross-section along line A-A' in FIG. 18C. The memory die 201 has two memory array regions 1804a, 1804b. There is a mid-block staircase 1852 between the two array regions 1804a, 1804b. FIGS. 18A and 18B show further details of embodiments of mid-block staircases. Region 1854 may be referred to as a word line bridge. Region 1854 provides an electrical connection for word lines in each array regions 1804a, 1804b.

Figures 18D, 18E:
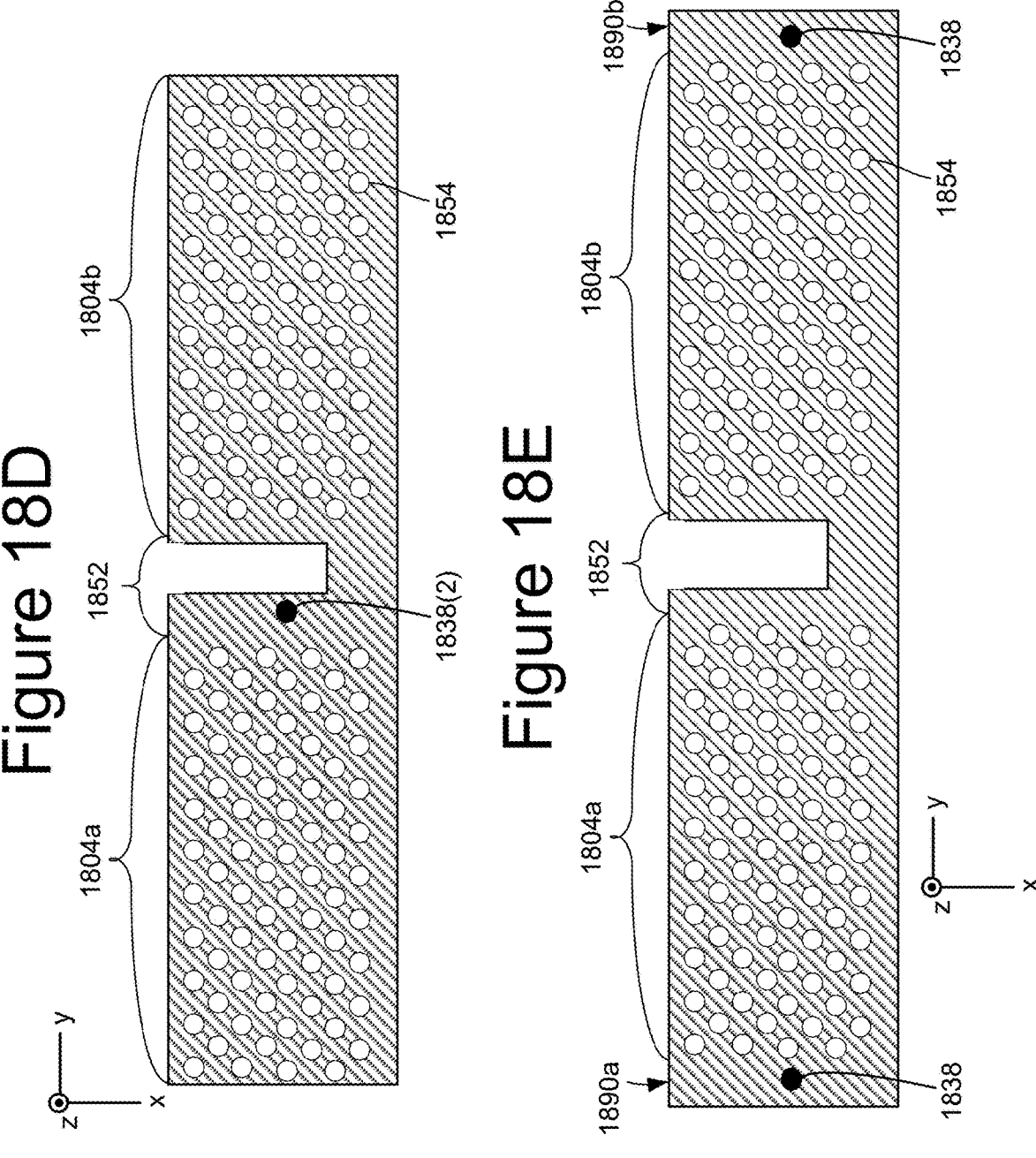
FIG. 18D depicts an example of an even word line layer (e.g., WL2) consistent with an embodiment of FIG. 18A.
FIG. 18E depicts an example of an odd word line layer (e.g., WL3) consistent with an embodiment of FIG. 18A.

FIG. 18D depicts an example of an even word line layer (e.g., WL2) consistent with an embodiment of FIG. 18A. Depicted are the two memory array regions 1804a, 1804b. The region of the mid-block staircase 1852 is also depicted. There will be a connection 1838(2) to the word line in the mid-block staircase 1852.

FIG. 18E depicts an example of an odd word line layer (e.g., WL3) consistent with an embodiment of FIG. 18A. Depicted are the two memory array regions 1804a, 1804b. The region of the mid-block staircase 1852 is also depicted. There is not any connection to the odd word line in the mid-block staircase 1852. However, there is a connection 1838 to the odd word line at each staircase 1890*a*, 1890*b*.

Figure 19:
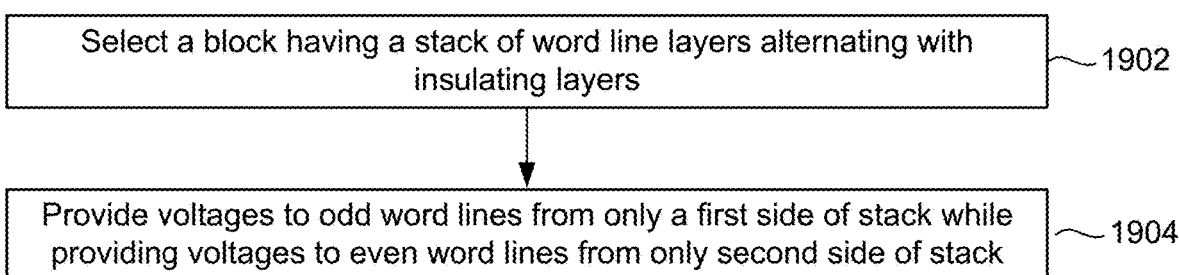
FIG. 19 is a flowchart of one embodiment of a process of operating a 3D memory structure having a stack of word lines alternating with insulating layers.

FIG. 19 is a flowchart of one embodiment of a process 1900 of operating a 3D memory structure having a stack of word lines alternating with insulating layers. Process 1900 may be used to drive odd numbered word lines from one end of the word lines while driving even numbered word lines from the other end of the word lines. Step 1902 includes selecting a block having a stack of word line layers alternating with insulating layers. In one embodiment, the block has a single a stack. In one embodiment, the block has multiple stacks. Step 1904 includes providing voltages to odd numbered word lines from only a first side of the stack while providing voltages to even numbered word lines form only a second side of the stack. The second side of the stack is opposite to the first side of the stack.

In a further embodiment to process 1900, the voltages provided to some of the word lines may be used to assist in ramping up the voltage on a selected word line. For example, step 1902 may include providing an operating voltage to a selected word line (WLn) Step 1904 may include providing a coupling up voltage to word lines adjacent (WLn−1, WLn+1) to the selected word line. The coupling up voltages on the adjacent word lines increase the voltage at the second end of the selected word line due to capacitive coupling between the selected word line and the adjacent word lines. Therefore, the coupling up voltages help to speed up the voltage ramp up on the selected word line. Moreover, note that the coupling up voltages are provided to the end of the selected word line that is not directly connected to a WL driver transistor. Therefore, current will not be wasted from a current being discharged to a WL driver transistor at that end of the selected word line. Moreover, there is not a WL driver transistor at that end of the selected word line to be damaged from such a discharge current. Therefore, the dangers of the coupling up voltages are reduced to thereby enable use of larger coupling up voltages on the adjacent word lines. Furthermore, the conventional coupling assist depicted in FIG. 9 provides the coupling voltage from the near end (same end as WLn). Therefore, the ramp up at the adjacent word lines (WLn+1, WLn−1) may be slow at their far ends, thereby reducing the conventional coupling up effect at the far end of WLn. However, with reference to FIG. 10, in an embodiment, the coupling up voltages that are applied to WLn−1 and WLn−1 are at the far end of WLn, thereby greatly helping the ramp up at the far end of WLn. Note also that the near ends of WLn−1 and WLn+1 ramp up fast due that the near ends being directly driven by the WL driver transistors, which speeds ramp up at the far end of WLn.

In some embodiments, conductive lines in a 3D memory array may be used to drive word lines. In one embodiment, the conductive lines are select lines (e.g., SGD, SGS) in a 3D NAND memory structure. For example, with reference to FIG. 4D, the SGD may be divided into a number of lines (e.g., SGDT0, SGDT1, SGD0, SGD1), which may be connected to their own respective drivers. As one example, SGDT0 and SGD0 are connected to drivers at one end and SGDT1 and SGD1 are connected to drivers at the other end. Thus, the voltage ramp up time on SGD lines may be reduced. The SGS lines (e.g., SGS1, SGS0, SGSB1, SGSB0) may be driven in a similar manner to help speed ramp up times.

One embodiment includes an apparatus comprising a group of memory cells, a plurality of conductive lines associated with the group of memory cells, and one or more control circuits in communication with the plurality of the conductive lines. The plurality of conductive lines extend in a y-direction parallel with each other. Each conductive line has a first end and a second end opposite the first end. The plurality of conductive lines include a first set of conductive lines that alternate with a second set of the conductive lines. The one or more control circuits configured to provide voltages to a first one or more points along the first set of the conductive lines while providing voltages to a second one or more points along the second set of the conductive lines. The first one or more points are different physical locations in the y-direction along the word lines than the second one or more points.

In a further embodiment, the first one or more points are the first ends of the first set of the conductive lines and the second one or more points are the second ends of the second set of the conductive lines.

In a further embodiment, the one or more control circuits comprise a first set of voltage drivers connected to the first ends of the first set of the conductive lines and a second set of voltage drivers connected to the second ends of the second set of the lines.

In a further embodiment, the first set of conductive lines comprise odd numbered word lines a three-dimensional NAND structure and the second set of conductive lines comprise even numbered word lines in the three-dimensional NAND structure.

In a further embodiment, the first set of conductive lines comprise first select lines in a three-dimensional NAND structure and the second set of conductive lines comprise second select lines in the three-dimensional NAND structure that alternate with the first select lines.

In a further embodiment, the first ends of the first set of conductive lines form a first staircase on a first side of a stack that comprises the plurality of conductive lines alternating with dielectric layers and the second ends of the second set of conductive lines form a second staircase on a second side of the stack opposite the first side of the stack.

In a further embodiment, the apparatus comprises a plurality of blocks, with each block comprising NAND strings and a plurality of word lines connected to the NAND strings. Each word line has a first end and a second end opposite the first end. The plurality of word lines comprise even numbered word lines that alternate with odd numbered word lines. The one or more control circuits are further configured to select a block and provide voltages to only the first ends of even numbered word lines in the selected block while providing voltages to only the second ends of odd numbered word lines in the selected block.

In a further embodiment, the one or more control circuits comprise a separate set of word line drivers for each of the blocks. The set of word line drivers for a particular block comprises a first set of voltage drivers connected to the first ends of the even numbered word lines in the particular block and a second set of voltage drivers connected to the second ends of the odd numbered word lines in the particular block.

In a further embodiment, the first set of the voltage drivers for even numbered blocks and the first set of the voltage drivers for odd numbered blocks are physically located on a first side of peripheral circuits and the second set of the voltage drivers for odd numbered blocks and the second set of the voltage drivers for the even number blocks are physically located on a second side of peripheral circuits.

In a further embodiment, the first set of the voltage drivers for even numbered blocks and the second set of the voltage drivers for odd numbered blocks are physically located are located on a first side of peripheral circuits and the second set of the voltage drivers for even numbered blocks and the first set of the voltage drivers for the odd number blocks are physically located on a second side of peripheral circuits.

In a further embodiment, the first one or more points are the first ends and the second ends of the first set of conductive lines and the second one or more points are midpoints in the y-direction of the second set of the conductive lines.

In a further embodiment, the word lines of a block are divided into a first stack and a second stack that each comprise word lines alternating with a dielectric. The apparatus comprises first peripheral circuits that correspond to the first stack and second peripheral circuits that correspond to the second stack. The first set of the voltage drivers for even and odd numbered blocks are located between the first peripheral circuits and the second peripheral circuits. A first group of the second set of the voltage drivers for even and odd numbered blocks are located on a side of the first peripheral circuits that is opposite the first set of the voltage drivers for even and odd numbered blocks. And a second group of the second set of the voltage drivers for even and odd numbered blocks are located on a side of the second peripheral circuits that is opposite the first set of the voltage drivers for even and odd numbered blocks.

In a further embodiment, the word lines of a block are divided into a first memory array region and a second memory array region that each comprise word lines alternating with a dielectric; the apparatus comprises first peripheral circuits that correspond to the first memory array region and second peripheral circuits that correspond to the second memory array region; a first set of the voltage drivers for even and odd numbered blocks are located between the first peripheral circuits and the second peripheral circuits; a first group of a second set of the voltage drivers for even and odd numbered blocks are located on a side of the first peripheral circuits that is opposite the first set of the voltage drivers for even and odd numbered blocks; and a second group of a second set of the voltage drivers for even and odd numbered blocks are located on a side of the second peripheral circuits that is opposite the first set of the voltage drivers for even and odd numbered blocks.

In a further embodiment, the group of memory cells and the plurality of conductive lines reside on a memory array die and the one or more control circuits reside on a control die that is bonded to the memory array die.

In a further embodiment, the group of memory cells and the plurality of conductive lines reside on a semiconductor die and the one or more control circuits reside on the semiconductor die.

An embodiment includes a method for operating a three-dimensional NAND memory system. The method comprises providing voltages to only first ends of odd numbered word lines in a stack of alternating word lines and insulating layers in the three-dimensional NAND memory system. The word lines are connected to control gates of memory cells. The method includes providing voltages to only second ends of even numbered word lines in the stack while providing the voltages to only the first ends of the odd numbered word lines. The second set of word lines alternate with the first set of word lines in the stack.

An embodiment includes a non-volatile storage system. The system comprises a memory die having a plurality of blocks and a control die attached to the memory die. Each block has a stack comprising word lines alternating with insulating layers. Each word line comprises a first end at a first side of the stack and a second end at a second side of the stack opposite the first side. Each block comprises NAND strings extending through the word lines. The control die has separate word line drivers for each of the blocks. The word line drivers for a particular block comprise a first set of voltage drivers connected to the first ends of even numbered word lines in the stack in the particular block and a second set of voltage drivers connected to the second ends of odd numbered word lines in the stack in the particular block. The control die also has one or more control circuits in communication with the first set of voltage drivers and the second set of voltage drivers. The one or more control circuits are configured to select a block for a memory operation. And operate the first set of voltage drivers of the selected block to provide voltages to only the first ends of the even numbered word lines in the stack in the selected block while operating the second set of voltage drivers of the selected block to provide voltages to only the second ends of the odd numbered word lines in the stack of the selected block.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, the apparatus comprising:

a group of memory cells;

a plurality of conductive lines associated with the group of memory cells, the plurality of conductive lines extending in a y-direction parallel with each other, each conductive line having a first end and a second end opposite the first end, the plurality of conductive lines including a first set of word lines that alternate with a second set of the word lines; and one or more control circuits in communication with the plurality of the conductive lines, the one or more control circuits configured to:

provide voltages to only the first ends of the first set of the word lines while providing voltages to only the second ends of the second set of the word lines, wherein providing the voltages to only the first ends of the first set of the word lines includes providing an operating voltage to a selected word line (WLn), the providing voltages to only the second ends of the second set of the word lines includes providing a coupling up voltage to word lines adjacent (WLn−1, WLn+1) to the selected word line, wherein the coupling up voltages on the adjacent word lines increases the voltage at the second end of the selected word line due to capacitive coupling between the selected word line and the adjacent word lines.

2. The apparatus of claim 1, wherein the one or more control circuits comprise:

a first set of voltage drivers connected to the first ends of the first set of the conductive lines, the first set of voltage drivers provide the voltages to the first ends of the first set of the conductive lines; and a second set of voltage drivers connected to the second ends of the second set of the lines, the second set of voltage drivers provide the voltages to the second ends of the second set of the conductive lines.

3. The apparatus of claim 1, wherein:

the first set of conductive lines comprise odd numbered word lines in a three-dimensional NAND structure; and the second set of conductive lines comprise even numbered word lines in the three-dimensional NAND structure.

4. The apparatus of claim 1, wherein the apparatus comprises a plurality of blocks, each block comprising:

NAND strings; and a plurality of word lines connected to the NAND strings, the plurality of word lines comprise even numbered word lines that alternate with odd numbered word lines; and the one or more control circuits are further configured to:

select a block; and provide voltages to only the first ends of even numbered word lines in the selected block while providing voltages to only the second ends of odd numbered word lines in the selected block.

5. The apparatus of claim 4, wherein the one or more control circuits comprise:

a separate set of word line drivers for each of the blocks, wherein the set of word line drivers for a particular block comprises:

a first set of voltage drivers connected to the first ends of the even numbered word lines in the particular block; and a second set of voltage drivers connected to the second ends of the odd numbered word lines in the particular block.

6. The apparatus of claim 5, wherein:

the first set of the voltage drivers for even numbered blocks and the first set of the voltage drivers for odd numbered blocks are physically located on a first side of peripheral circuits; and the second set of the voltage drivers for odd numbered blocks and the second set of the voltage drivers for the even number blocks are physically located on a second side of peripheral circuits.

7. The apparatus of claim 5, wherein:

the first set of the voltage drivers for even numbered blocks and the second set of the voltage drivers for odd numbered blocks are physically located on a first side of peripheral circuits; and the second set of the voltage drivers for even numbered blocks and the first set of the voltage drivers for the odd number blocks are physically located on a second side of peripheral circuits.

8. The apparatus of claim 1, wherein:

the group of memory cells and the plurality of conductive lines reside on a memory array die; and the one or more control circuits reside on a control die that is bonded to the memory array die.

9. The apparatus of claim 1, wherein:

the plurality of conductive lines reside in a stack that includes the plurality of conductive lines alternating with insulating layers;

the stack has a first staircase formed by the first ends of the first set of conductive lines; and the stack has a second staircase formed by the second ends of the second set of conductive lines.

10. A method for operating a three-dimensional NAND memory system, the method comprising:

providing voltages to only first ends of odd numbered word lines in a stack of alternating word lines and insulating layers in the three-dimensional NAND memory system, the word lines connected to control gates of memory cells, including providing an operating voltage to a selected word line (WLn); and providing voltages to only second ends of even numbered word lines in the stack while providing the voltages to only the first ends of the odd numbered word lines, the odd numbered word lines alternate with the even numbered word lines in the stack, including providing a coupling up voltage to word lines adjacent (WLn−1, WLn+1) to the selected word line, wherein the coupling up voltages on the adjacent word lines increases the voltage at the second end of the selected word line due to capacitive coupling between the selected word line and the adjacent word lines.

11. A non-volatile storage system, the system comprising:

a memory die having a plurality of blocks, each block having a stack comprising word lines alternating with insulating layers, wherein each word line comprises a first end at a first side of the stack and a second end at a second side of the stack opposite the first side, wherein each block comprises NAND strings extending through the word lines; and a control die attached to the memory die, the control die having separate word line drivers for each of the blocks, wherein the word line drivers for a particular block comprise:

a first set of voltage drivers connected to the first ends of even numbered word lines in the stack in the particular block;

a second set of voltage drivers connected to the second ends of odd numbered word lines in the stack in the particular block; and one or more control circuits in communication with the first set of voltage drivers and the second set of voltage drivers, the one or more control circuits configured to:

select a block for a memory operation; and operate the first set of voltage drivers of the selected block to provide voltages to only the first ends of the even numbered word lines in the stack in the selected block while operating the second set of voltage drivers of the selected block to provide voltages to only the second ends of the odd numbered word lines in the stack of the selected block.

12. The non-volatile storage system of claim 11, wherein:

the first set of the voltage drivers for even numbered blocks and the first set of the voltage drivers for odd numbered blocks are located to a first side of peripheral circuits on the control die; and the second set of the voltage drivers for odd numbered blocks and the second set of the voltage drivers for the even numbered blocks are located to a second side of the peripheral circuits on the control die.

13. The non-volatile storage system of claim 11, wherein:

the second set of the voltage drivers for even numbered blocks and the first set of the voltage drivers for odd numbered blocks are located to a first side of peripheral circuits on the control die; and the first set of the voltage drivers for odd numbered blocks and the second set of the voltage drivers for the odd numbered blocks are located to a second side of peripheral circuits on the control die.

14. The non-volatile storage system of claim 11, wherein:

the word lines of a block are divided into two regions;

the first ends of the word lines are located at a midpoint of the two regions;

the first set of the voltage drivers for even and odd numbered blocks are located in a first stripe on the control die that is adjacent to the first ends of the word lines;

a first group of the second set of the voltage drivers for even and odd number blocks are physically located in a second stripe on the control die that is adjacent to the second ends of the word lines in a first of the two regions; and a second group of the second set of the voltage drivers for even and odd number blocks are physically located in a third stripe on the control die that is adjacent to the second ends of the word lines in a second of the two regions.

15. The non-volatile storage system of claim 11, wherein:

the stack has a first staircase formed by the first ends of the odd numbered word lines; and the stack has a second staircase formed by the second ends of the even numbered word lines.

16. A memory system, the memory system comprising:

a block having a plurality of word lines alternating with a dielectric in a stack, the block having NAND strings associated with the plurality of word lines, the plurality of word lines including a first set of the word lines that alternate with a second set of the word lines, the plurality of word lines extending in a y-direction parallel with each other, each word line having a first end, a second end opposite the first end, and a midpoint approximately midway between the first end and the second end; and one or more control circuits in communication with the plurality of the word lines, the one or more control circuits configured to:

provide voltages to only the midpoint of the first set of the word lines while providing voltages to only the first end and the second end of the second set of the word lines.

17. The memory system of claim 16, wherein the midpoints of the first set of conductive lines form one or more staircases at mid-array in the y-direction, the first ends of the second set of conductive lines form a first staircase on a first side of the stack, the second ends of the second set of conductive lines form a second staircase on a second side of the stack.

18. The memory system of claim 16, wherein:

the block is one of a plurality of blocks in the memory system;

the plurality of word lines of each block are divided into a first memory array region and a second memory array region; and the memory system further comprises:

first peripheral circuits that correspond to the first memory array region;

second peripheral circuits that correspond to the second memory array region;

a first set of voltage drivers configured to drive the midpoints of the first set of the word lines in even and odd numbered blocks, the first set of voltage drivers located between the first peripheral circuits and the second peripheral circuits;

a second set of voltage drivers configured to drive the first ends of second set of the word lines in the even and the odd numbered blocks, the second set of voltage drivers located on a side of the first peripheral circuits that is opposite the first set of the voltage drivers; and a third set of voltage drivers configured to drive the second ends of the second set of the word lines in the even and the odd numbered blocks, the third set of voltage drivers located on a side of the second peripheral circuits that is opposite the first set of the voltage drivers.

* * * * *